United States Patent
Shiga

(10) Patent No.: US 7,193,896 B2
(45) Date of Patent: Mar. 20, 2007

(54) MULTI-VALUE SEMICONDUCTOR MEMORY DEVICE AND METHOD CAPABLE OF CACHING A LOWER PAGE DATA UPON AN INCOMPLETE WRITE OF AN UPPER PAGE DATA

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/167,301

(22) Filed: Jun. 28, 2005

(65) Prior Publication Data
US 2006/0227624 A1    Oct. 12, 2006

(30) Foreign Application Priority Data
Apr. 11, 2005   (JP)   ............................. 2005-113575

(51) Int. Cl.
*G11C 29/04* (2006.01)
*G11C 16/06* (2006.01)

(52) U.S. Cl. ...................... 365/185.09; 365/185.03; 365/185.17; 365/185.12; 365/185.11

(58) Field of Classification Search ........... 365/185.17, 365/185.03, 185.09, 185.11, 185.12
See application file for complete search history.

(56) References Cited

U.S. PATENT DOCUMENTS

| 6,496,412 B1 | 12/2002 | Shibata et al. ......... 365/185.03 |
| 6,525,966 B1 * | 2/2003 | Hollmer et al. .......... 365/185.2 |
| 6,829,167 B2 | 12/2004 | Tu et al. ................. 365/185.18 |
| 6,996,014 B2 * | 2/2006 | Lee et al. ............... 365/189.05 |

FOREIGN PATENT DOCUMENTS

JP       2001-93288      4/2001

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A semiconductor memory device includes: a memory cell array, in which electrically rewritable and non-volatile memory cells are arranged to store multi-value data; a sense amplifier circuit configured to read data of and write data in the memory cell array; and a controller configured to control data read and write of the memory cell array, wherein the controller has such a function as, when an upper page data write sequence ends in failure, the upper page data being one to be written into an area of the memory cell array where lower page data has already been written, to cache the lower page data read out of the memory cell array and held in the sense amplifier circuit.

20 Claims, 19 Drawing Sheets

FIG. 17

|  | A | B | C | D |
|---|---|---|---|---|
| Write Data Loaded in SDC | 1 | 0 | 1 | 0 |
| Write Data Set in PDC | 1 | 1 | 0 | 0 |
| Verify Pass (Vv2) | 1 | 1 | 0 | 0 |
| Verify Pass (Vv3) | 1 | 1 | 1 | 0 |

FIG. 18

|  | A | B | C | D |
|---|---|---|---|---|
| Write Data Loaded in SDC | 1 | 0 | 1 | 0 |
| Write Data Set in PDC | 1 | 0 | 1 | 1 |
| Verify Pass (Vv1) | 1 | 0 | 0 | 0 |

MULTI-VALUE SEMICONDUCTOR MEMORY DEVICE AND METHOD CAPABLE OF CACHING A LOWER PAGE DATA UPON AN INCOMPLETE WRITE OF AN UPPER PAGE DATA

CROSS-REFERENCE TO RELATED APPLICATION

This application is based on and claims the benefit of priority from the prior Japanese Patent Application No. 2005-113575, filed on Apr. 11, 2005, the entire contents of which are incorporated herein by reference.

BACKGROUND OF THE INVENTION

1. Field of the Invention

This invention relates to a semiconductor memory device (EEPROM) having electrically rewritable and non-volatile semiconductor memory cells, specifically to a data write method thereof.

2. Description of Related Art

A NAND-type flash memory is known as one of EEPROMs (Electrically Erasable and programmable ROMs). A memory cell array of the NAND-type flash memory is formed of NAND cell units arranged therein. Each NAND cell unit has plural memory cells connected in series in such a manner that adjacent two memory cells share a source/drain layer.

Therefore, the NAND-type flash memory has features as follows: it is easy to increase the memory capacitance because the unit cell area of the memory cell array is smaller than that of a NOR-type EEPROM; and it is possible to perform substantially high-speed data read and write with such a scheme that data read and write is performed by a page.

To increase the data capacity of a NAND-type flash memory in comparison with currently used ones, it is used such a multi-value data storage scheme that one memory cell stores multi bits. For example, in a four-value data storage scheme, four-value data "xy" is used, which is defined by upper page data "x" and lower page data "y".

Four-value data "xy" is, for example, as shown in FIG. 4, defined as that "11", "10", "00" and "01" are assigned in order of cell's threshold voltage. Data "11" is an erased state where the cell is set in a negative threshold voltage state. Data "10" may be written with selectively writing lower page data "y" (="0") into the erased state memory cells while data "00" and "01" may be written with selectively writing upper page data "x"(="0") into memory cells with data "10" and "11", respectively (for example, refer to Unexamined Japanese Patent Application Publication No. 2001-93288).

SUMMARY OF THE INVENTION

According to an aspect of the present invention, there is provided a semiconductor device including:
a memory cell array, in which electrically rewritable and non-volatile memory cells are arranged to store multi-value data;
a sense amplifier circuit configured to read data of and write data in the memory cell array; and
a controller configured to control data read and write of the memory cell array, wherein
the controller has such a function as, when an upper page data write sequence ends in failure, the upper page data being one to be written into an area of the memory cell array where lower page data has already been written, to cache the lower page data read out of the memory cell array and held in the sense amplifier circuit.

According to another aspect of the present invention, there is provided a semiconductor memory device including:
a memory cell array with electrically rewritable and non-volatile memory cells arranged therein; and
a controller configured to control data write of the memory cell array, wherein
each memory cell in the memory cell array is to store one of four-value data "xy" (where "x" and "y" are upper and lower page data, respectively, and "11", "01", "10" and "00" are assigned in order of cell's threshold voltage), and wherein
the controller executes:
a first write sequence for writing intermediate data into memory cells to be written into data "10" in a sector of the memory cell array, the entire memory cells in which have been erased in a data "11" state, the intermediate data being defined by a threshold voltage lower than a desired threshold voltage of data "10";
a second write sequence for writing data "10" and "00" into the memory cells with the intermediate data written in the sector; and
a third write sequence for writing data "01" into the memory cells with data "11" in the sector after the second write sequence.

BRIEF DESCRIPTION OF THE DRAWINGS

FIG. 17 is a diagram for showing a data state in the sense amplifier circuit in the second write sequence.

FIG. 18 is a diagram for showing a data state in the sense amplifier circuit in the third write sequence.

DETAILED DESCRIPTION OF THE EMBODIMENTS

As described above, to write four-value data, it is in need of performing a lower page write sequence and an upper page write sequence. In case the upper page write sequence ends in failure or is forcedly suspended, for example, due to a command input, it is provable that target memory cells are left in an incomplete threshold state. Therefore, it is also provable that it becomes impossible to read out lower page data which have been normally written. If the lower page data, which have already been written, are not stored anywhere in the flash memory system, there is a fear that the lower page data are completely lost.

According to embodiments described below, it will be provided a semiconductor memory, data of which is correctable.

EMBODIMENT 1

Figure 1:
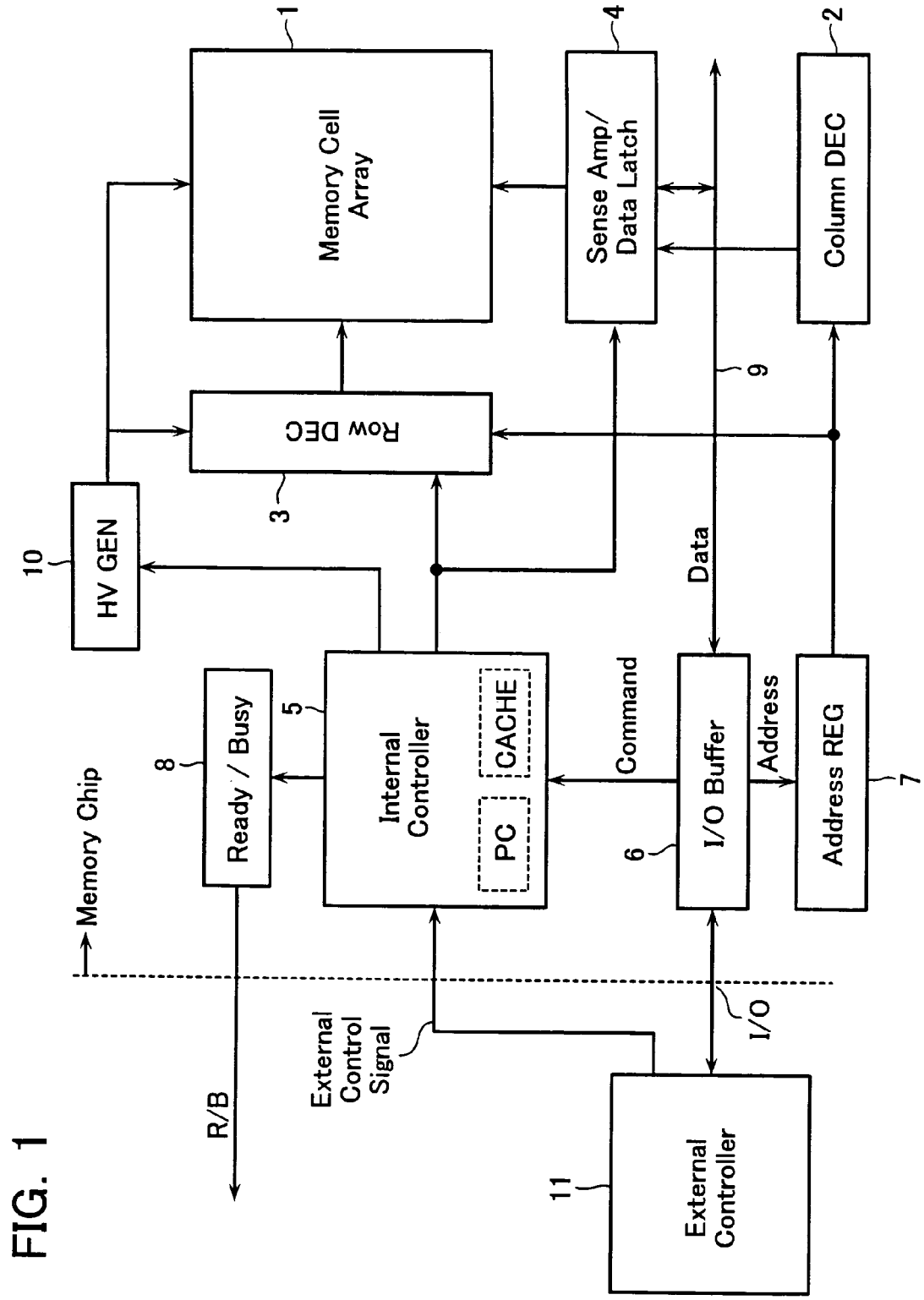
FIG. 1 shows a functional block configuration of a flash memory in accordance with an embodiment of the present invention.
Figure 2:
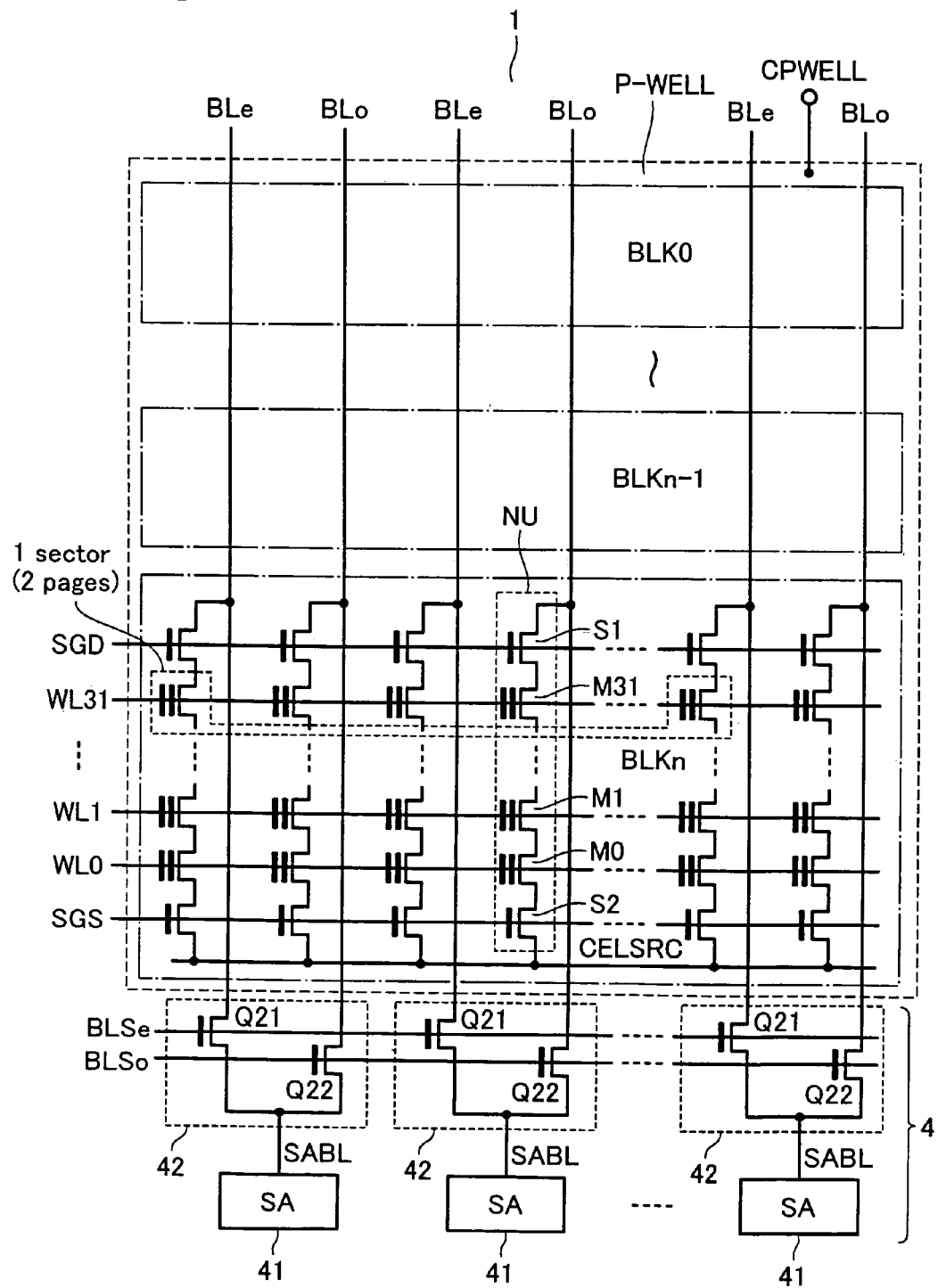
FIG. 2 shows a memory cell array in the flash memory.

FIG. 1 shows a functional block of a NAND-type flash memory in accordance with an embodiment. A memory cell array 1 is, as shown in FIG. 2, formed of NAND cell units, NU, arranged therein. Each NAND cell unit has a memory cell string with a plurality of (i.e., thirty two in this case shown in FIG. 2) memory cells M0–M31 connected in series and select gate transistors, which couple both ends of the memory cell string to a bit line BL and a common source line CELSRC, respectively.

Control gates of the memory cells M0–M31 are coupled to different word lines WL0–WL31; and gates of the select gate transistors S1 and S2 to select gate lines SGD and SGS, respectively, which are disposed in parallel with the word lines.

A set of NAND cell units sharing word lines constitutes a block serving as a unit of data erasure. As shown in FIG. 2, the memory cell array 1 is formed of plural blocks, BLKi, arranged in the direction of the bit line.

Row decoder 3 serves for selecting a word line in the memory cell array 1; and column decoder 2 for selecting bit lines therein. A sense amplifier circuit 4 including data latches is connected to bit lines and serves for reading data of the memory cell array and holding write data.

At a data read time, read data in the sense amplifier circuit 4 are output to external input/output terminals I/O via data bus 9 and data buffer 6. At a data write time, write data are supplied to the terminals I/O from the external memory controller 11, and loaded in the sense amplifier circuit 4 via the data buffer 6 and data bus 9.

Command data and address data supplied from the input/output terminals I/O are decoded in an internal controller 5 and transferred via address register 7 to row decoder 3 and column decoder 2, respectively. The internal controller 5 executes data write or erase sequence and data read in response to external control signals supplied in accordance with operation modes. The internal controller 5 includes a write counter, PC, for counting write cycle numbers and a cache, CACHE, with ability to store at least one page data.

A status register 8 is set to store a ready/busy signal R/B for designating whether the chip is in a busy state or a ready state, and outputting it outside of the chip. To generate various high voltages higher than the power supply voltage, there is provided a high voltage generating circuit 10, which is controlled by the internal controller 5.

In the memory cell array arrangement, it is used such a shared sense amplifier scheme that an even numbered bit line BLe and an odd numbered bit line BLo disposed adjacent to each other share a sense amplifier (SA) 41. This is because of that it becomes difficult to dispose sense amplifiers for every miniaturized bit line pitch. In this shared sense amplifier scheme, bit line select circuits 42 are disposed between sense amplifiers (SA) 41 and the corresponding even/odd bit lines BLe/BLo so that either one of even/odd bit lines BLe/BLo is coupled to a sense amplifier SA.

In the memory cell array arrangement, a set of memory cells selected by one word line and the entire even numbered bit lines BLe constitutes a sector; and another set of memory cells selected by the same word line and the entire odd numbered bit lines BLo constitutes another sector. In a binary data storage scheme, one sector becomes one page serving as a unit of data read and write. In a four-value data storage scheme, one sector becomes two pages (i.e., upper page and lower page).

Figure 3:
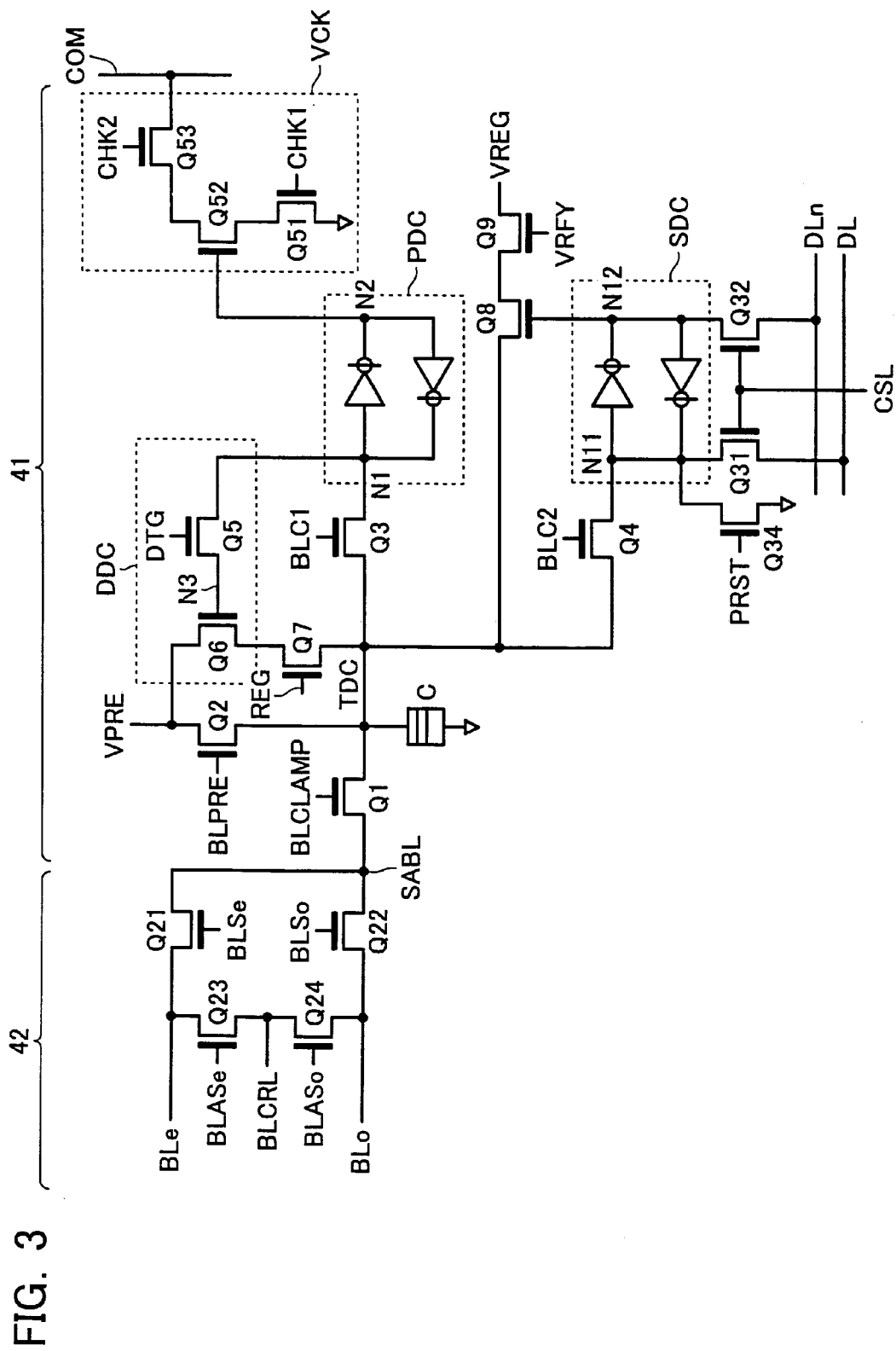
FIG. 3 shows a sense amplifier circuit in the flash memory.

FIG. 3 shows a sense unit, which has a sense amplifier 41 and a bit line select circuit 42, to be coupled to one of a pair of bit lines BLe/BLo. Bit line select circuit 42 includes a select transistors Q21 and Q22, gates of which are driven by select signals BLSe and BLSo, for selectively coupling the bit lines BLe and BLo to a node SABL, and biasing transistors Q23 and Q24 for applying a fixed bias voltage BLCRL to non-selected bit line BLe or BLo.

Sense node TDC is coupled to the node SABL via a clamping NMOS transistor, and the node SABL is coupled to one of bit lines BLe and BLo via bit line select transistor Q21 or Q22. This clamping transistor Q1 serves for clamping bit line voltage and serves as a pre-sense amplifier for detecting bit line voltage in accordance with cell data in a data read mode; and serves for transferring voltage in accordance with write data to a bit line in a data write mode.

Connected to the sense node TDC is a precharging NMOS transistor Q2, which is used for precharging a bit line to a certain voltage in a data read mode.

Two data storage circuits (data latches) PDC and SDC are coupled to the sense node TDC via transferring NMOS transistors Q3 and Q4, respectively. These data storage circuits PDC and SDC are used in accordance with operation modes. For example, data storage circuit SDC is such a data latch that it is used for transmitting/receiving read data/write data between the external I/O terminals and itself. Therefore, data nodes N11 and N12 thereof are coupled to data lines DL and DLn via column select transistors Q31 and Q32.

Data storage circuit SDC stores write data for defining a bit line voltage in a data write mode. That is, write data supplied from the exterior is loaded in the data storage circuit SDC, and then transferred to the data storage circuit PDC. In accordance with the write data held in the data storage circuit PDC, bit line control voltage is decided, thereby deciding channel voltage of a NAND cell unit. After having set the NAND cell channel voltage, a write cycle will be repeatedly performed, which includes write voltage application and the following write-verify read. The data storage circuit PDC stores data read in the sense node TDC at a data read time. In each write cycle, write-verify is performed for every bit and the successive write data is determined. For this propose, another data storage circuit DDC is disposed between the data node N1 of the data storage circuit PDC and the sense node TDC for temporarily storing write data. Gate node N3 of the NMOS transistor Q6 is a data storage node of this data storage circuit DDC. Transferring NMOS transistor Q5 is disposed between the data node N1 and data storage node N3 for transferring write data held in the data storage circuit PDC. A write-back NMOS transistor Q6 is disposed between the transistor Q6 and the sense node TDC for writing back data to the sense node TDC.

At a data write time, write data is set in the data storage circuit SDC as follows: "0" write data is set as N1="L", which is used for changing the cell's threshold voltage into a positive direction; and "1" write data (i.e., write-inhibiting) is set as N1="H", which is used for keeping the cell's threshold voltage at a negative state (i.e., erased state) as it is. Based on these write data, the respective NAND cell channels are controlled to have at certain voltages. When write voltage is applied to a selected word line under this condition, electrons are injected into the floating gate of "0" write cell while electron injection will not be occurred in the "1" write cell.

At a write-verify read time, "verify voltage" is applied to the selected word line, which corresponds to the lowest value of the threshold distribution of to-be-verified data, and it is detected whether a precharged bit line is discharged or not via a selected cell. "0" write cell is not turned on with the verify voltage applied to the selected word line, so that the bit line will not be discharged. Therefore, this data state is read out as TDC="H", and it becomes "1" write (i.e., write inhibiting) hereinafter.

By contrast to this, a bit line corresponding to such a cell that "0" write is insufficient or "1" data is written will be discharged, thereby being read out as "L" data. Therefore, in the following write cycle, based on the last cycle write data held in the data storage circuit DDC, write data is written back to data storage circuit PDC in such a way that "1" write data becomes "H" data again.

When all "0" write data in one page have been written completely, the entire data nodes N1 in the data storage circuits PDC become to be in an all "H" state (i.e., all "1" state). To detect the all "1" state of one page data storage circuits PDC, thereby judging write completion, there is prepared a verify-check circuit VCK coupled to the data storage circuit PDC.

In the four-value data storage scheme, it is necessary to perform lower page write and upper page write because one cell stores two bits. "0" write for increasing cell's threshold voltage and "1" write (write-inhibiting) for maintaining cell's threshold voltage as it is are used in both of the above-described lower page write and upper page write.

Upper page write is in need of two write-verify operations with different verify-conditions from each other for verifying two data states. In the upper page write sequence, the write-verify needs referring to the lower page data, which has already been written. For this purpose, the data storage circuit SDC serves for holding the lower page data read out from the memory cell array 1 during the upper page write sequence, and forcedly discharging a bit line(s) at a verify-read time in accordance with the lower page data held therein. For the purpose of such the bit line voltage control, transistors Q8 and Q9 are prepared for transferring data stored in the data storage circuit SDC to a bit line(s).

Figure 4:
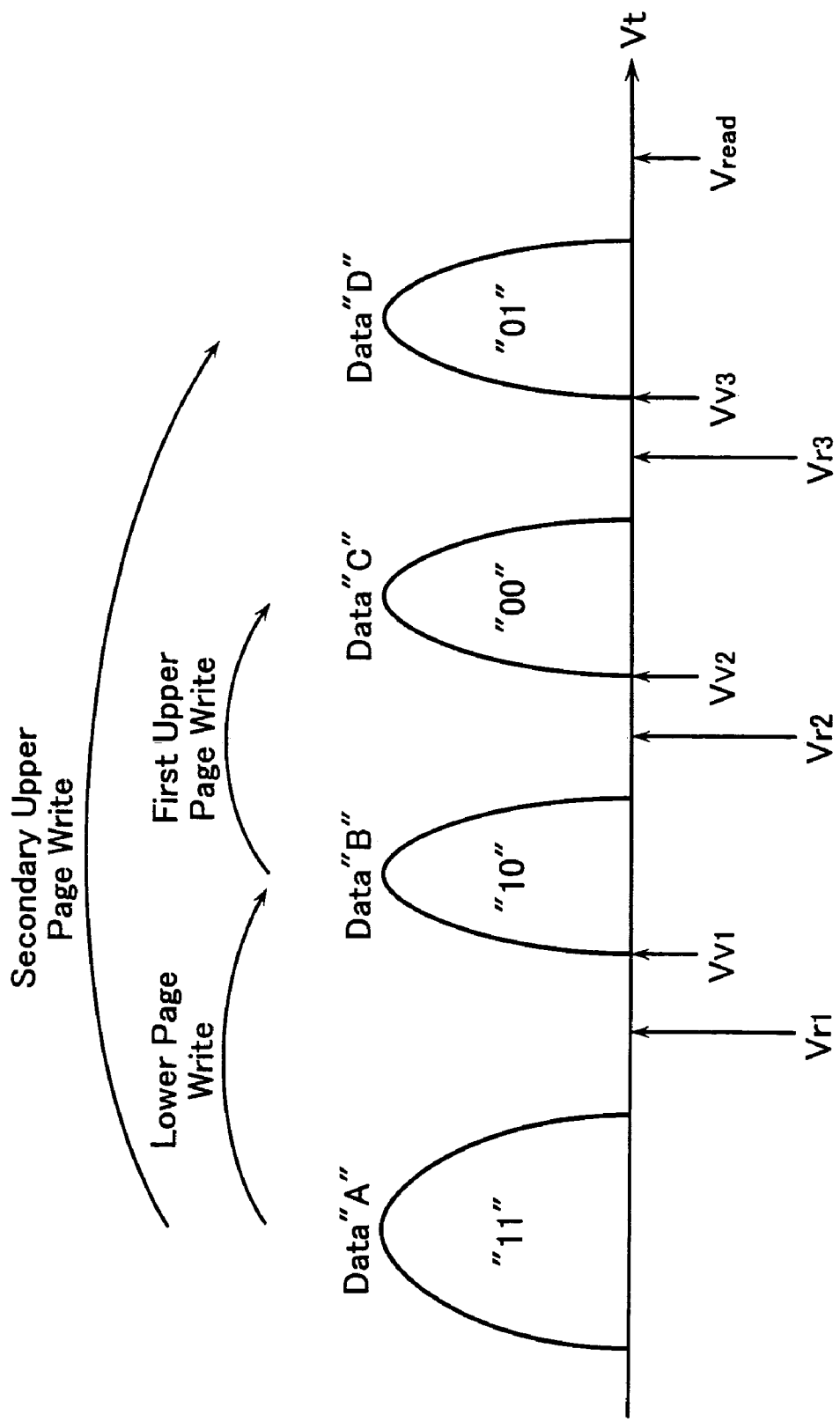
FIG. 4 shows an example of data bit assignment in four-value data and data write scheme thereof.

FIG. 4 shows an example of data threshold distributions in a four-value data storage scheme. Four-value data A, B, C and D are arranged in order of the threshold voltage. Supposing that the four-value data is expressed as "xy", where "x" is upper page data; and "y" lower page data, it is used here such a data bit assignment that A=11, B=10, C=00 and D=01. Data "A" is an erased state with the lowest threshold voltage (i.e., negative threshold voltage).

Data erase is performed by a block. At an erase time, the entire word lines in a selected block are set to be 0V; and erase voltage, Vera (for example, 20V), is applied to the p-type well, on which the memory cell array 1 is formed. With this voltage application, the entire cells in the selected block experience electron releasing from floating gates thereof and are changed to be in a negative threshold voltage state (data "A").

Figure 5:
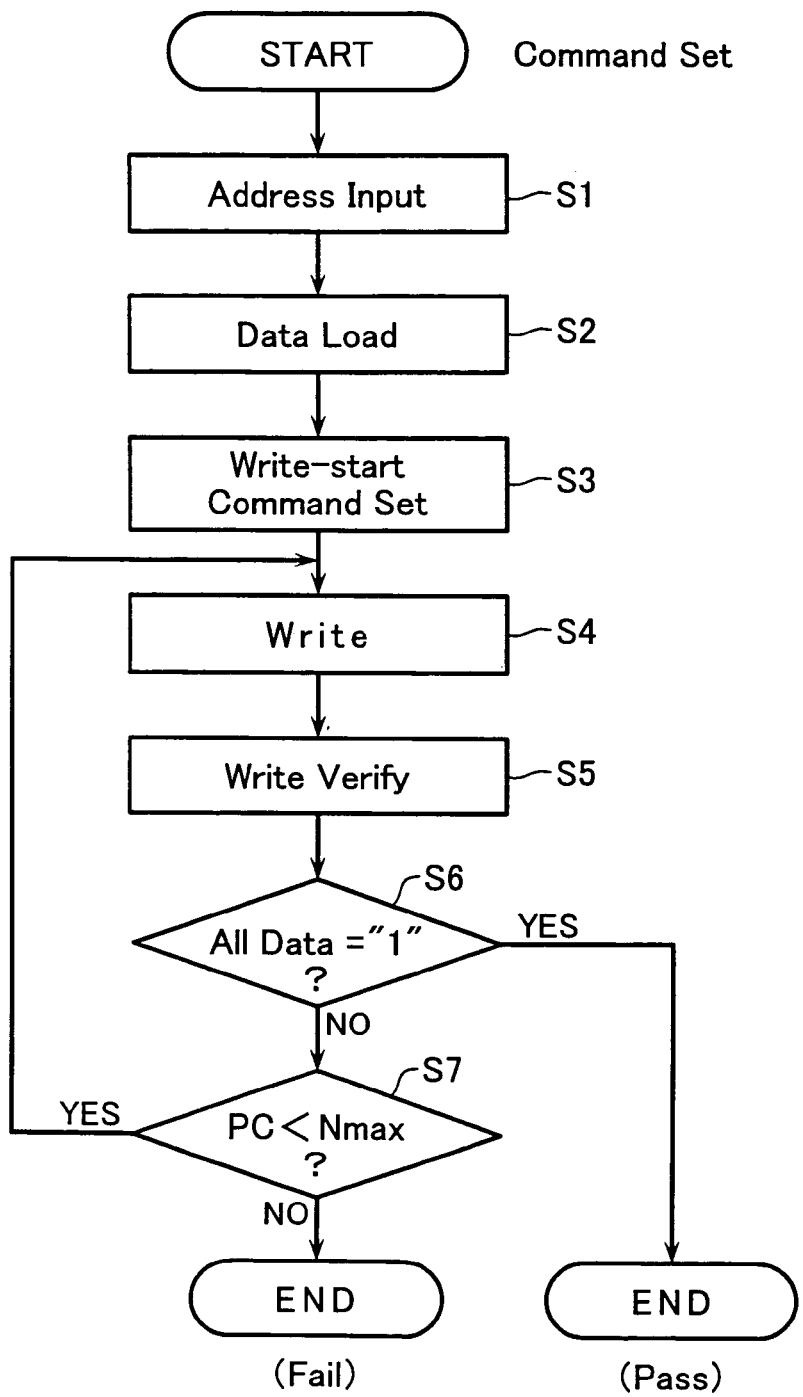
FIG. 5 shows an operation flow of lower page write.

As shown in FIG. 4, data write is in need of doing lower page write and upper page write. Lower page write is for selectively causing cell(s) of data "A" to be in a data "B" state. FIG. 5 shows a control flow of the lower page write. This write sequence starts in response to a command input. Input address data (step S1); load write data (step S2); and input write start command (step S3), and the internal controller starts to execute data write. Note here that although lower page and upper page in a sector have an identical physical address, different logic addresses from each other are assigned to these lower page and upper page in the external memory controller 11.

Write data loaded in the data storage circuit DC is "0" (for writing data "B") or "1" (for maintaining data "A", i.e., write-inhibiting). In accordance with these write data "0" and "1", NAND cell channels are set at a low level (Vss) and a floating high level (Vdd), respectively. Thereafter, as write voltage Vpgm is applied to a selected word line, electron injection occurs in cell(s), to which "0" data is supplied, while electron injection does not occur in cell(s), to which "1" data is supplied (step S4). With this write voltage application, cells in the selected page are selectively increased in threshold voltage.

After the write operation, write-verify is performed for verifying the write state (step S5). At this write-verify time, verify voltage Vv1, which is set at the lowest value of data "B" threshold voltage distribution, is used. Then, write completion judgment is performed (step S6). If data write has been completed, a "Pass" flag is output, following it the sequence ends (normal end).

In case data write is incomplete, detect whether the count value of the write counter (PC) has reached the predetermined maximum value Nmax or not (step S7). If not reached, return to step S4 and data write is performed again.

The write completion judgment is performed in such a way as to detect whether one page data storage circuits have become an all "1" state or not. If the PC value has reached the maximum value Nmax, a "Fail" flag is output, following it the sequence ends (abnormal end).

Upper page write includes a first upper page write mode for selectively causing cell(s) of data "B" to be in a data "C" state and a second upper page write mode for selectively causing cell(s) of data "A" to be in a data "D" state. These two types of upper page write operations are performed simultaneously for a selected page in a write sequence. That is, the first and second upper page write modes are performed with an identical "0" write operation for increasing the threshold voltage.

Figure 6:
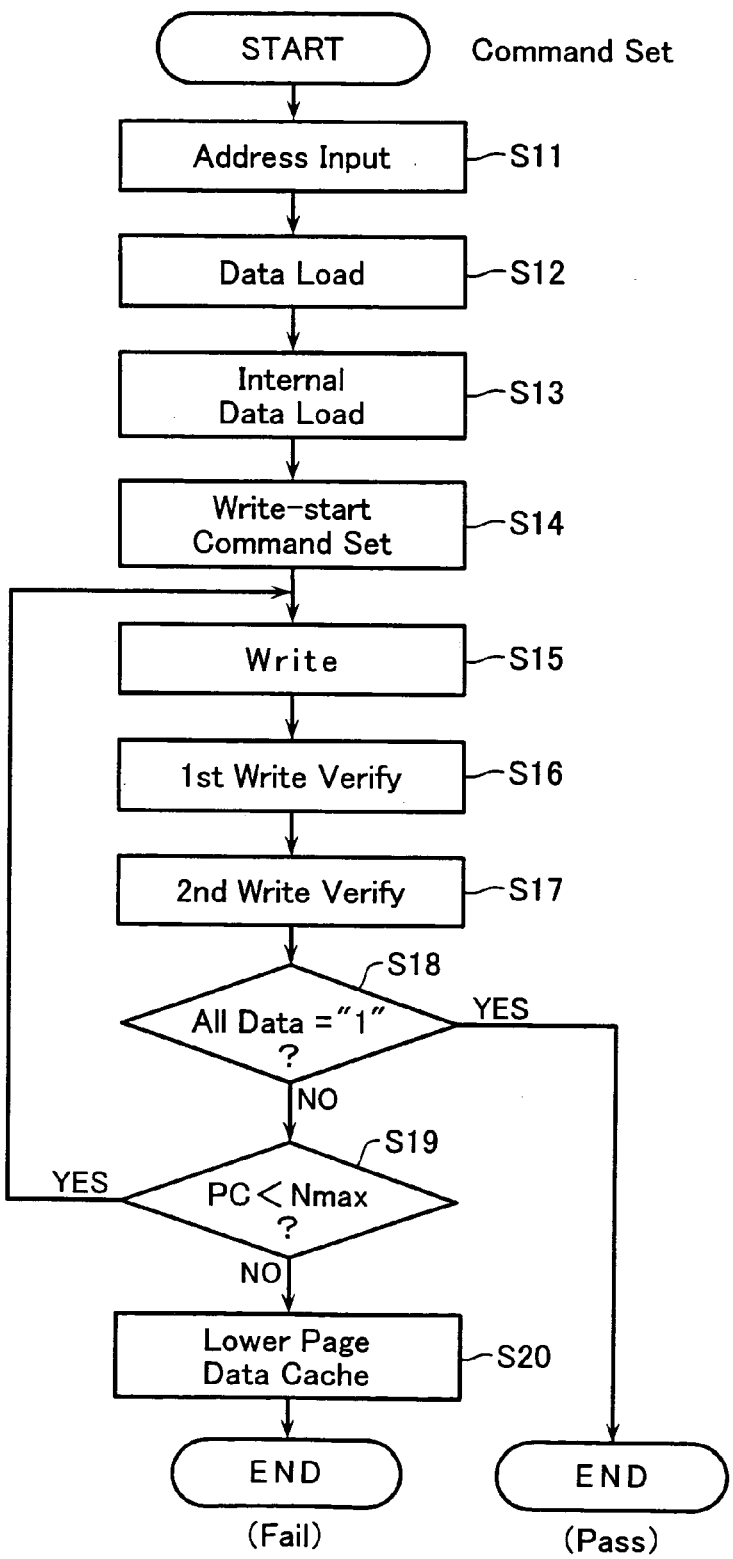
FIG. 6 shows an operation flow of upper page write.

FIG. 6 shows an operation flow of the upper page write sequence. Input address data (step S11); load write data (step S12); and read out the lower page data from the memory cell array, which is required for write-verifying (step S13). Write data externally supplied are loaded in the data storage circuits PDC, and the lower page data internally read out are stored in the data storage circuits SDC. Thereafter, as write start command is input (step S14), sequential write operations will be automatically performed under the control of the internal controller.

At the write step S15, the first and second upper page write operations shown in FIG. 4 are performed simultaneously. Write-verify operations of these upper page write are performed in different steps from each other because it is necessary for use different verify voltages from each other. That is, verify voltage Vv2 is used at the first upper page write-verify step S16; and verify voltage Vv3 at the second upper page write-verify step S17.

The write verify step of the first upper page write needs verifying a write state for only data "C" and excluding data "D" from the verify target. For this purpose, the lower page data stored in the data storage circuits SDC will be referred to. In detail, data "A" and "B" are read out as data "1" and "0", respectively, with a read voltage Vr1 applied to the selected word line, and these read data are stored in the data storage circuits SDC (step S13).

With reference to the lower page data stored in the data storage circuit SDC, it is possible to exclude data "D" from the verify target at the first upper page write. Although the detailed description is omitted, it becomes possible with bit line voltage controlling by use of transistors Q8 and Q9 disposed at the data storage circuit SDC side. That is, in the bit lines, to which "H" data are read out as a result of the verify-read, one(s) corresponding to data "D" are forcedly discharged based on the data stored in the data storage circuits SDC, thereby being read out as "L" level data (i.e., "1" data).

At the second upper page write with verify voltage Vv3, data "C" is read out as "1" data. Therefore, it is possible to verify the write state of data "D" without referring to the lower page data. Write completion judgment step S18 is, as similar to the lower page write, performed with detecting whether the data storage circuits PDC have become an all "1" state or not.

If it is judged that data write has been completed, the sequence ends (normal end). In case data write is incomplete, detect whether the PC value has reached the maximum value Nmax or not (step S19). If not reached, return to step S15 and data write is performed again. If the PC value has reached the maximum value Nmax, cache the lower page data read in the sense amplifier circuit 4 prior to the abnormal end. For example, the lower page data is transferred to and temporarily stored in the cache CACHE in the internal controller 5, or output outside of the chip to be temporarily stored in the external memory controller 11.

Note here that in case the upper page write sequence is to be suspended or discontinued in response to a certain command input, the lower page data will be cached as similar to the above-description.

As a result, when the upper page write ends in failure or forcedly suspended, it is possible to correct data. That is, when the upper page write ends in failure, the lower page data stored in the same physical address are destroyed. However, in this embodiment, the lower page data is not completely lost, but is cached. Therefore, perform copy-write the cached lower page data and the remaining data stored in the block to a spare block, write data may be corrected. This copy-write operation will be explained later.

Normal data read is performed with one upper page data read operation and two lower page data read operations.

Initially, the upper page data read is performed with read voltage Vr2, which is set between the threshold distributions of data "B" and "C". Data "A" or "B", the upper page data "x" of which is "1", is read out as data "1"; and data "C" or "D", the upper page data of which is "0", is read out as data "0".

Next, a first lower page read operation with read voltage Vr1, which is set between data "A" and "B", and a second lower page read operation with read voltage Vr3, which is set between data "C" and "D" are sequentially performed. As s result, it is possible to distinguish data between "A" and "B", and between data "C" and "D".

Each of read voltages Vr1–Vr3 used in the above-described write operations is one applied to the selected word line. Applied to non-selected word lines and select gate lines is read pass voltage Vread higher than the uppermost value of the entire data threshold distributions as shown in FIG. 4. With this voltage application, non-selected cells are turned on without regard to cell data. Therefore, detect whether bit line current flows or not in accordance with selected cell's data, and it is possible to sense data. Note here that read pass voltage Vread is also used in the write-verify read operation.

Operations of the sense amplifier circuit 4 at the data read time will be briefly explained below. Initially, the clamping transistor Q1 and precharging transistor Q2 are turned on, thereby precharging the bit line to a certain voltage while the select gate transistor in the selected block is off. Then the transistors Q1 and Q2 are turned off, and the select gate transistor in the selected block is turned on. Selected memory cells disposed along the selected word line are turned on or off with relation to read voltage applied to the selected word line. Therefore, with the above-described voltage application, a bit line corresponding to a "1" data cell is discharged; and another bit line corresponding to a "0" data cell is not discharged. After a certain time period, the clamping transistor Q1 is turned on again, whereby the bit line discharge state is transferred to the sense node TDC. Therefore, bit line voltage is transferred to the sense node as a low level or a high level defined by the charge distribution between the bit line and sense node TDC.

Figure 7:
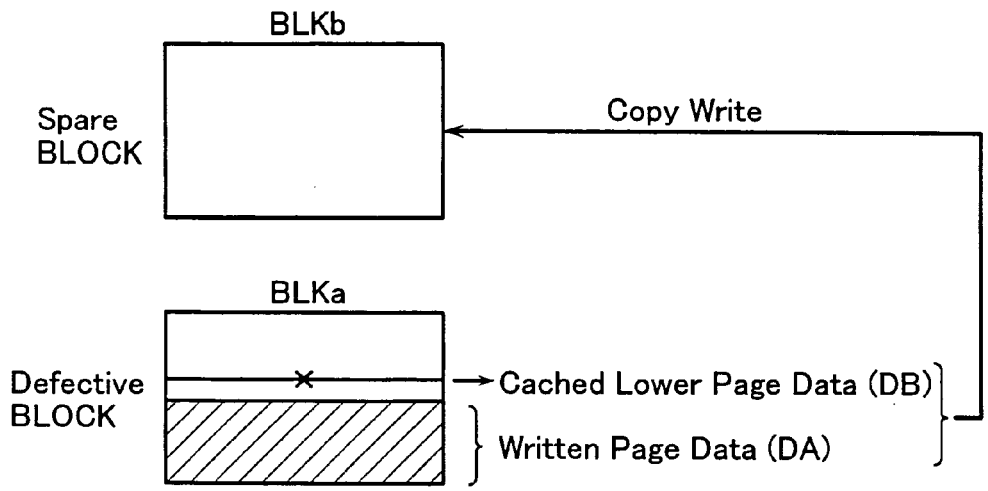
FIG. 7 is a diagram for explaining a copy-write operation when the upper page write ends in failure.

FIG. 7 shows an example of data correcting operation in a case that the upper page data write ends in failure. As described above, when the upper page write ends in failure, a recovery operation is performed in the chip for storing the lower page data held in the sense amplifier circuit 4.

As shown in FIG. 7, a block BLKa, in which the upper page write ends in failure, will be dealt as a defective block. Page data (DA), which have already been written into this block BLKa, are copy-written into a spare block BLKb, and the cached lower page data (DB) also is written into a corresponding page in the block BLKb.

Figure 8:
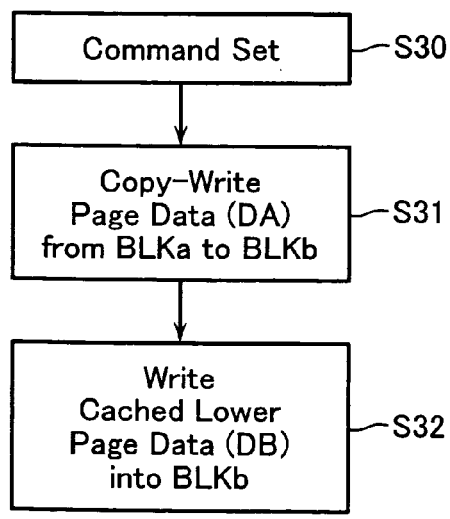
FIG. 8 shows an operation flow of the copy-write.

FIG. 8 shows a flow chart of the above-described copy-write controlled by the internal controller 5. As a command data is set in the internal controller 5 (step S30), copy-write is executed (step S31). At this copy-write step S31, there are two cases as follows: one is that the written data (DA) in the block BLKa are lower page data (i.e., only data "A" and "B" shown in FIG. 4 have been written); and the other is that the written data (DA) include upper page data (i.e., data "A", "B", "C" and "D" have been written). In every case, it will be repeatedly performed such a page-copy operation that a page data is read out from the cell array and then written into a corresponding page in the spare block BLKb.

Next, the controller 5 executes a write step S32. This step S32 is for loading the lower page data (DB), which is cached in the internal controller 5 or output to the external memory controller 11, in the sense amplifier circuit 4, and then writing it into a corresponding page in the spare block BLKb.

In this embodiment, as described above, when the upper page write ends in failure halfway, the lower page data stored in the sense amplifier circuit is temporarily cached and stored prior to ending of the sequence. As a result, the lower page data may be prevented from being completely lost. Further, copy-write the data written in the defective block to a spare lock, and write the cached lower page data into the spare block, and it becomes possible to correct data.

EMBODIMENT 2

Next, another embodiment 2 will be explained below, which includes such a write scheme that it is able to write data at a higher rate than the above-described embodiment 1, and obtain a high reliability of data. The NAND-type flash memory in accordance with this embodiment 2 has basically the same functional block, memory cell array and sense amplifier circuit as those shown in FIGS. 1, 2 and 3, respectively.

Figure 9:
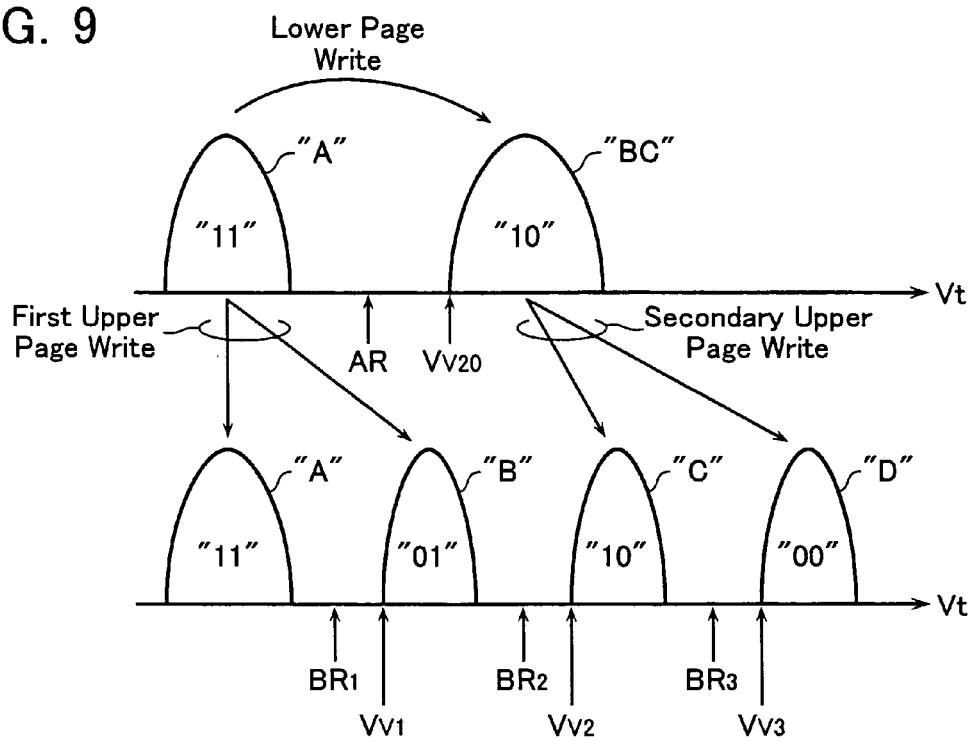
FIG. 9 is a diagram for explaining another four-value data storage scheme.

Data bit assignment of the four-value data in this embodiment 2 is different from that in the embodiment 1. As shown in FIG. 9, the four-value data "A"="11", "B"="01", "C"="10" and "D"="00" are defined in order of the threshold voltage.

Data write is, as shown in FIG. 9, performed with lower page write and upper page write operations. Lower page write is for selectively writing an intermediate data state "BC" into cell(s) with data "A" (i.e., erased state). The intermediate data has such a threshold distribution that extends over the threshold distributions of data "B" and "C". The threshold distribution of the intermediate data "BC" has the lowest value Vv20, which is lower than that Vv2 of data "C" and higher than that Vv1 of data "B", and is broader than that of data "10" to be finally written.

Upper page write includes a first upper page write mode for selectively writing "0" into cell(s) of data "A", thereby writing data "B" with the lowest threshold value Vv1 and a second upper page write mode for selectively writing "0" into cell(s) of intermediate data "BC" with the broad threshold distribution, thereby writing data "D" with the lowest threshold value Vv3. The second upper page write mode includes a lower page write operation for changing cell(s) of data "BC" to have desirable data "C" with the lowest threshold value Vv2.

In the first upper page write mode, "1" write cell(s) (i.e., write-inhibiting cell(s)) keeps the data "A" state as it is. Data "C" and "D" write in the second upper page write mode may be achieved with such a write-verify operation that verify voltage thereof is exchanged from Vv2 to Vv3 in each write cycle.

The four-value data storage scheme shown in FIG. 9 has a feature that data reliability is higher in comparison with the scheme shown in FIG. 4, and there is possibility to do high-speed write. The reason will be explained below.

The more miniaturized the cell array, the greater the capacitance coupling between floating gates of adjacent memory cells. Due to this, memory cell data along a first word line, which have already been written, are strongly influenced by memory cell data along a second word line adjacent to the first word line, which are to be written later. In the scheme shown in FIG. 4, data writing from data "A" to "D" within the second upper page write mode brings about a large threshold voltage change. In this case, therefore, the interference between floating gates affects cell data, thereby reducing data reliability. By contrast, since it is not used such a write mode that brings about a large threshold voltage change in the four-value data storage scheme shown in FIG. 9, data reliability becomes high.

Further, in the scheme shown in FIG. 9, the lower page write for writing data "BC" is for writing a broad threshold voltage distribution, and has no need of precisely controlling the threshold voltage. Therefore, high-rate data write may be performed. The upper page write for writing data "C" and "D" is performed with such write-verify that verify voltage is exchanged in one write cycle. Therefore, this data write may also be performed with a high-rate.

At the upper page write time in accordance with the four-value data storage scheme shown in FIG. 9, there is a difference between externally loaded write data and write data to be applied as control voltages to the bit lines of the cell array. That is, externally loaded upper page data are set as "1", "0", "1" and "0" to be distinguished from each other in correspondence to data "A", "B", "C" and "D", respectively. By contrast to this, the upper page data to be applied in practice to the cell array is required to be set as "0" write data for increasing cell's threshold voltage with respect to data "B", "C" and "D". Therefore, it is required of the chip to internally transfer the externally loaded write data among the storage circuits SDC, PDC and DDC in the sense amplifier circuit 4 so as to set desirable write data to be held in the data storage circuit PDC.

Further, for write-verifying in the upper page write mode, it is also required to do bit line voltage control with reference to the lower page data. For this purpose, the lower page data are read out from the cell array and internally transferred in the sense amplifier circuit 4 so that desirable data are set in the data storage circuit SDC and DDC for defining bit line control voltage at the write-verify time.

In the four-value data storage scheme shown in FIG. 9, the lower page data write is performed so as to have a broad threshold distribution that is different from the final data threshold distribution. Therefore, a lower page read voltage BR2 used after having written the upper page data is different from another lower page read voltage AR used while the upper page data have not yet written. Further, when an area of the cell array is read out, it is impossible to externally recognize whether the area stores only the lower page data or stores both of the lower page and upper page data. Therefore, flag data is used for serving as an index for defining a data read condition in accordance with the internal data state.

Figure 10:
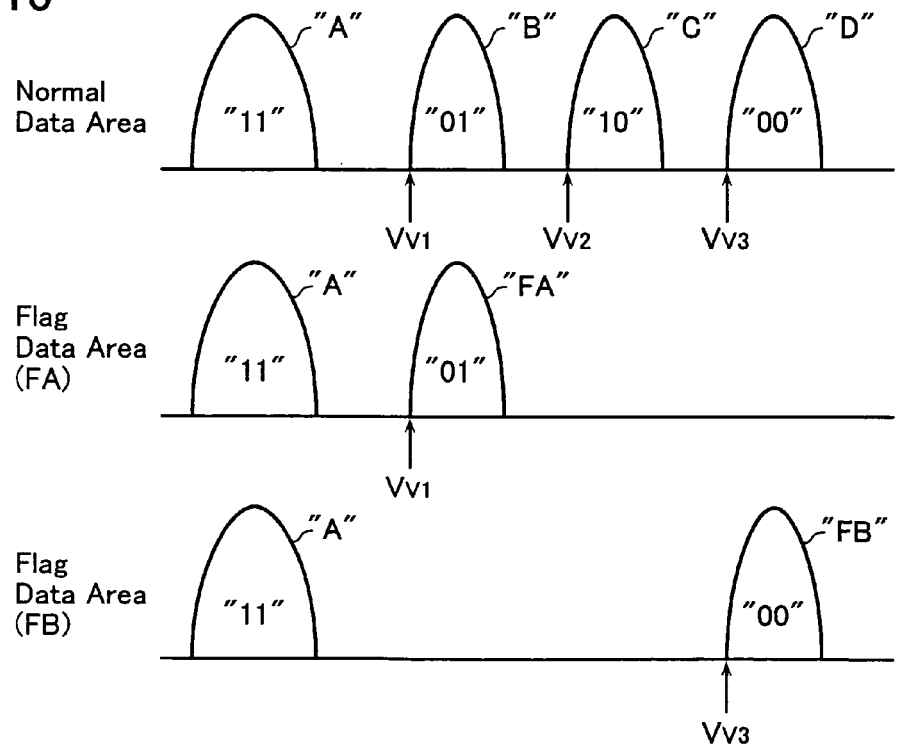
FIG. 10 is a diagram for explaining flag data in the four-value data storage scheme/

For example, as shown in FIG. 10, a first and second flag data "FA" and "FB" are prepared. The former is written under the same condition as in the first upper page write mode; and the latter under the same condition as in the second upper page write mode. These flag data are set as one bit data or few (or several) bits data in a column area different from the normal data area in the cell array. It is desirable that each flag data is constituted by few (or several) bits to be decided by a majority of decision thereof.

The first flag data "FA" is written with the same lowest threshold value Vv1 as that of data "B"; and the second flag data "FB" is written with the same lowest threshold value Vv3 as that of data "D".

Figure 11:
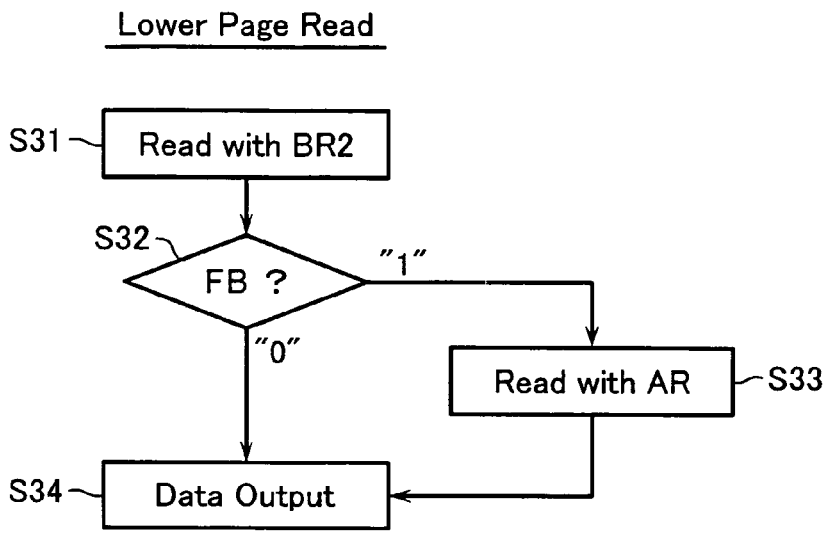
FIG. 11 shows a flow of lower page data read of a flash memory with the four-value data storage scheme.

FIG. 11 shows a flow of the lower page data read operation. Initially, the lower page data read is performed with the read voltage BR2 set between data "B" and "C" on the assumption that threshold voltage distributions shown at the lower column in FIG. 9 are formed (step S31).

Next, judge whether the second flag "FB" is "1" (this designates that the upper page has not been written) or "0"

(this designates that the upper page has been written) (step S32). If FB=1, the read data is output as it is (step S34). If FB=0, since data threshold distributions are set as shown at the upper column in FIG. 9, the lower page is read out (step S33), and the read data will be output (step S34).

Figure 12:
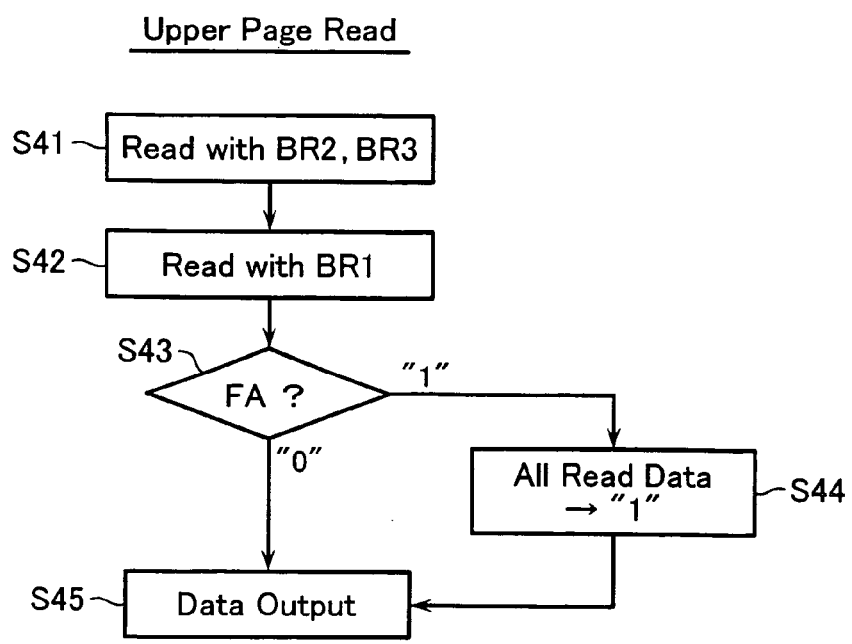
FIG. 12 shows a flow of upper page data read of a flash memory with the four-value data storage scheme.

FIG. 12 shows a flow of the upper page data read operation. The upper page read is basically performed with three read steps with read voltages BR1, BR2 and BR3 shown at the lower column in FIG. 9. At the second upper page write time for writing data "C" and "D", it is used only one time write operation with such a write-verify operation that verify voltage thereof is exchanged halfway. Corresponding to this, it is desirable that data "C" and "D" are read out simultaneously with such read voltage as being exchanged from BR2 to BR3.

Therefore, as shown in FIG. 12, data read is initially performed with read voltages BR2 and BR3 (step S41). Explaining in detail, after bit line precharge, data read is performed with read voltage BR2, whereby the upper page data "1" and "0" of data "C" and "D" are read as "H" data (="0" data) to the data storage circuit TDC. This read data at the circuit TDC is transferred to the data storage circuit DDC, following it the sense node TDC is precharged to Vdd again, and read voltage is exchanged from BR2 to BR3, then next data read is performed. That is, the upper page data "0" of data "D" is read as "H" data (="0") to the data storage circuit TDC.

Next, data read is performed with read voltage BR1 (step S42). At this step, data "B", "C" and "D" are read as "H" data. However, true data "C" and "D" have already been read out at step S41. Therefore, data at the sense node TDC is controlled based on the read data in the data storage circuits DDC and PDC so that the upper page data "1", "0", "1" and "0" of the respective data "A", "B", "C" and "D" may be finally read out to data storage circuit PDC.

Thereafter, it is judged whether the first flag data "FA" is "0" (this means that the upper page data has been written) or "1" (this means that the upper page data has not been written). If FA=0, read data in the sense amplifier circuit 4 will be read out outside of the chip as it is. In case of FA=1, the upper page data has not been written, the threshold distributions are shown as in the upper column in FIG. 9, i.e., the upper page data are in an all "1" state. Therefore, the entire read data are changed to "1" (step S44), and this will be read out outside of the chip.

If power supply is shut off in the course of upper page write in the data write scheme of the four-value data storage scheme shown in FIG. 9, the lower page data also will be lost because data distribution of data "BC" at the upper column and that of data "B" at the lower column in FIG. 9 are superimposed on each other.

Therefore, a desirable write scheme in this embodiment 2 is to be performed as follows: a write sequence is performed for selectively writing data "C" and "D" into cells with the intermediate data "BC"; following it the next write sequence is performed for selectively writing data "B" into cells of data "A".

Figure 13:
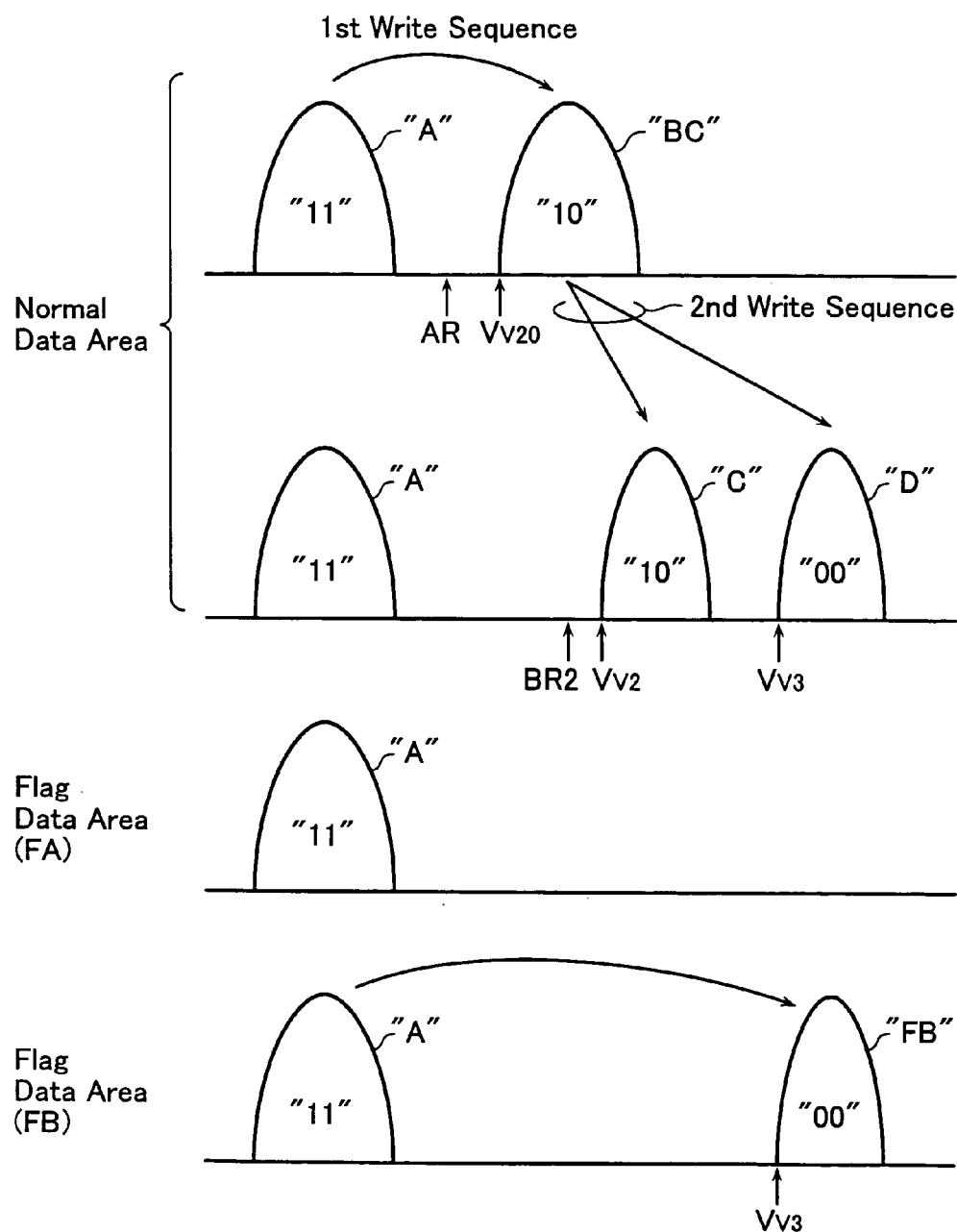
FIG. 13 is a diagram for explaining first and second write sequences in a flash memory in accordance with another embodiment where a variation of the four-value data storage scheme shown in FIG. 9 is used.

The upper page scheme in accordance with this embodiment 2 will be explained with reference to FIGS. 13 and 14 below. The final four-value data threshold distribution is the same as shown at the lower column in FIG. 9. FIG. 13 shows status changes in accordance with first and second write sequences. The first write sequence is the same as the lower page write shown in FIG. 9, in which the intermediate data state "BC" with the lowest threshold value of Vv20 is selectively written into erased cells of data "A" in a selected sector.

The second write sequence is such upper page write that data "D" with the lowest threshold value Vv3 is selectively written into cells of data "BC". This write sequence also includes a write operation for writing data "C" with the lowest threshold value of Vv2 into cells of data "BC". In this second data write sequence, the second flag data "FB" is written simultaneously into the second flag data area. This flag data "FB" is preferably written as data formed of few or several bits and with the same lowest threshold value of Vv3 as that of data "D".

Figure 14:
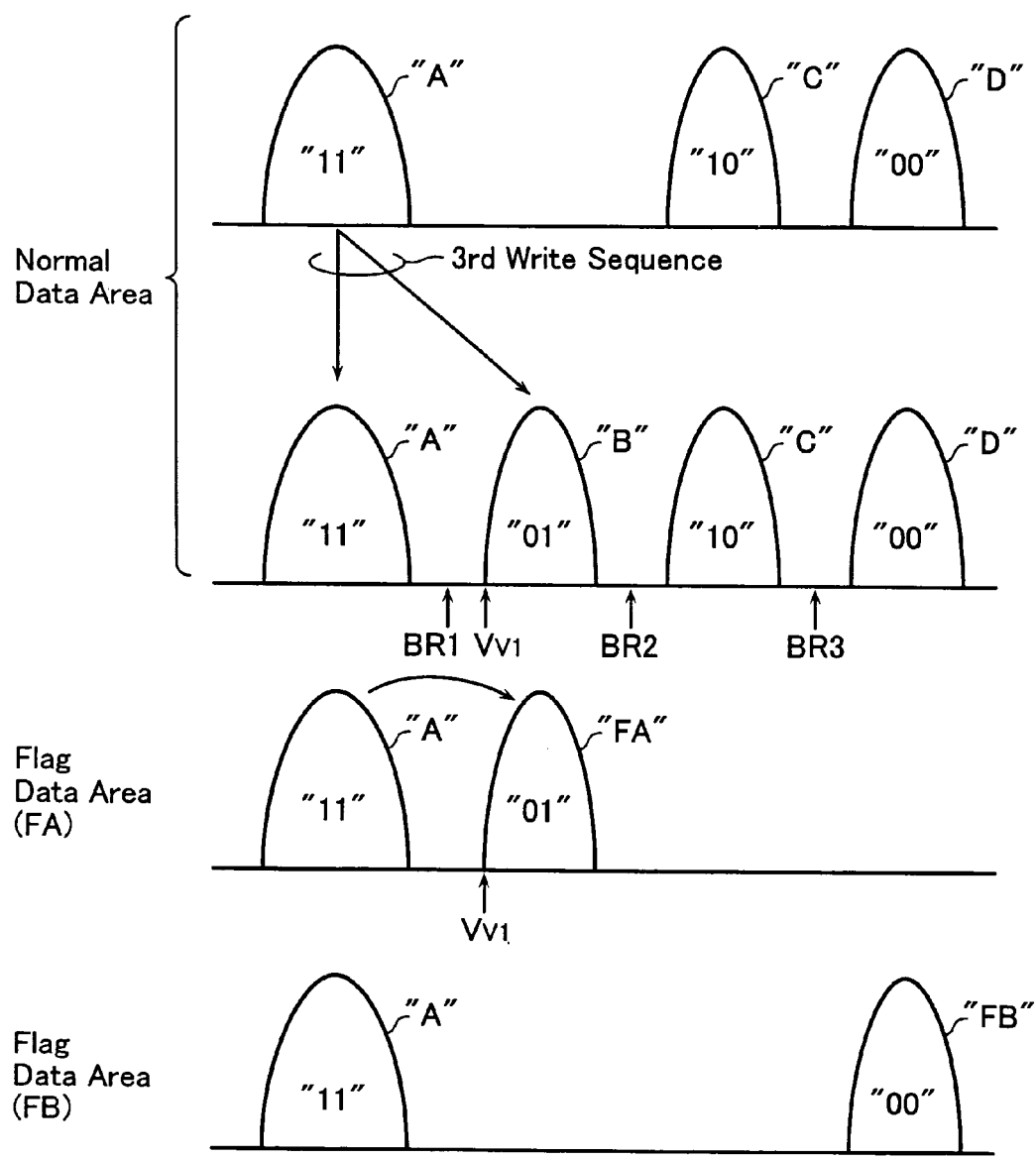
FIG. 14 a diagram for explaining a third write sequence in the flash memory in accordance with the embodiment.

Thereafter, as shown in FIG. 14, the third data write sequence (i.e., the upper page write sequence) is performed in such a way that data "B" with the lowest threshold value of Vv1 is selectively written into cells of data "A" in the selected sector. In this third data write sequence, the first flag data "FA" is written simultaneously into the first flag data area. This flag data "FA" is preferably written as data constituted by few or several bits and with the same lowest threshold value of Vv1 as that of data "B".

Figure 15:
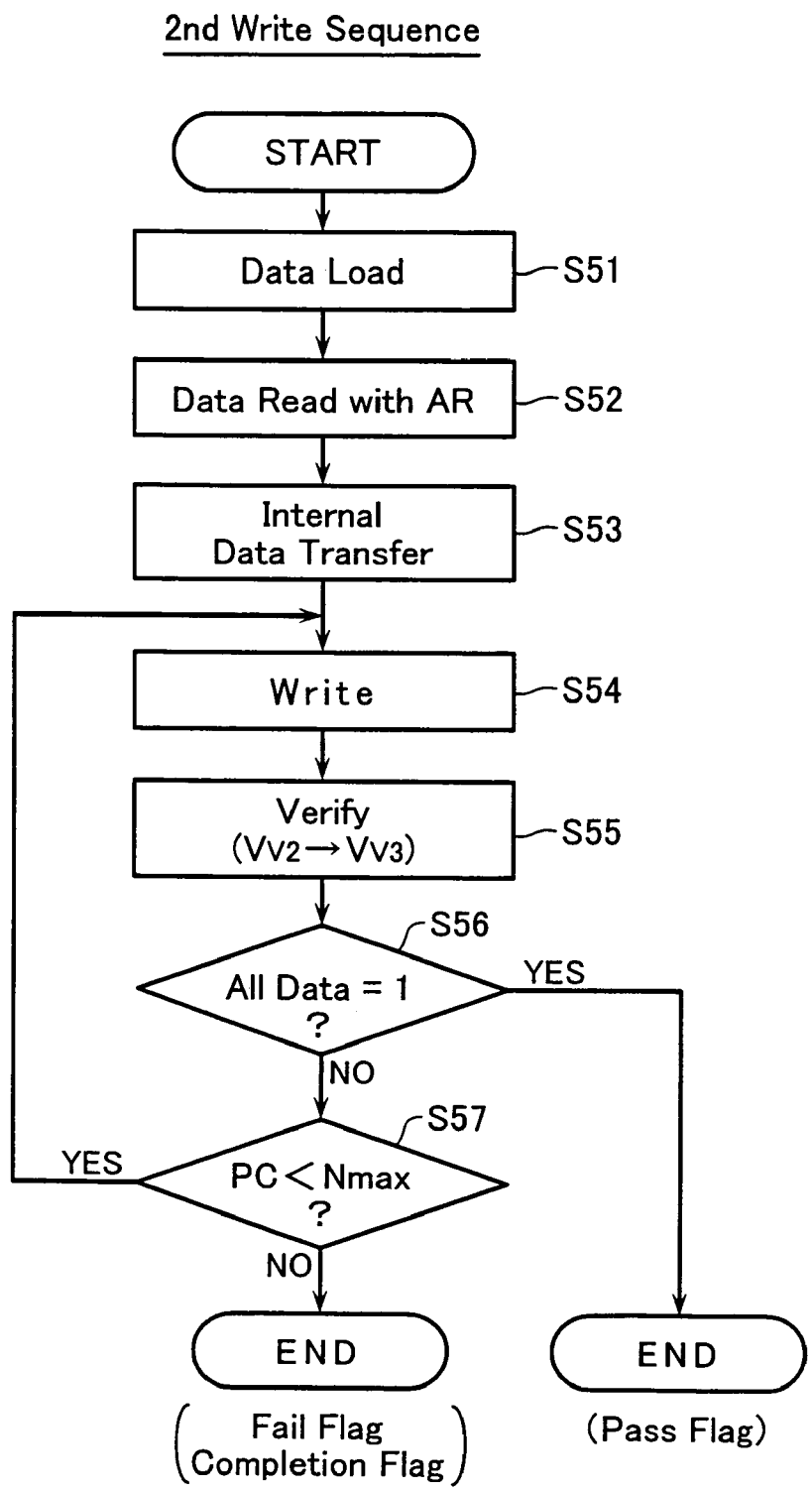
FIG. 15 shows an operation flow of the second write sequence.

The second and third write sequences will be explained in detail with reference to FIGS. 15 to 18 below. FIG. 15 shows the second write sequence, in which command input and address input are the same as the ordinary write sequence (not shown). As shown in FIG. 15, write data are loaded (step S51), and then cell array data are read out (step S52).

Since this write sequence is the upper page write sequence in principle, the loaded data are, as shown in FIG. 17, "1", "0", "1" and "0" in correspondence to data "A", "B", "C" and "D", respectively. These data are loaded in the data storage circuits SDC. The internal data read operation at the step S52 is performed with read voltage AR set between data "B" and "BC" as shown in FIG. 13.

As described above, "0" write is performed for not only data "D" but also data "C" in the second write sequence. Therefore, as shown in FIG. 17, internal data transferring operations are performed among the data storage circuits PDC, SDC and DDC so that "1", "1", "0" and "0" are set in the data storage circuits PDC corresponding to data "A", "B", "C" and "D", respectively (step S53).

Data write will be performed based on the above-described write data (step S54). The write-verify for data "C" and "D" are performed in one step (step S55). In detail, this write-verify is performed in such a way that verify voltage thereof is changed from Vv2 (the lowest threshold value of data "C") to Vv3 (the lowest threshold value of data "D") in the course of bit line discharge.

With respect to data "C" and "D" write, in case the threshold voltage is equal to or higher than Vv2, as shown in FIG. 17, read data corresponding to data "A", "B", "C" and "D" become "1", "1", "0" and "0", respectively, as a result of the former half of the write-verify. With respect to data "D" write, in case the threshold voltage is equal to or higher than Vv3, read data corresponding to data "A", "B", "C" and "D" become "1", "1", "1" and "0", respectively, as a result of the latter half of the write-verify. These designate a condition of "Pass" of the write-verify with verify voltages Vv2 and Vv3.

The verify-read data are controlled in such a way that when the above-described condition of "Pass" is satisfied, the data storage circuits PDC become an all "1" state, and it is detected whether data write has been completed or not (step S56). In case data write is incomplete, it is detected whether the write count value PC has reached the maximum value Nmax or not (step S57). If NO, write operation will be repeated (step S54). In case data write is not completed in spite of that the count value PC has reached the maximum value Nmax, a "Fail" flag is output and the sequence ends in failure.

Figure 16:
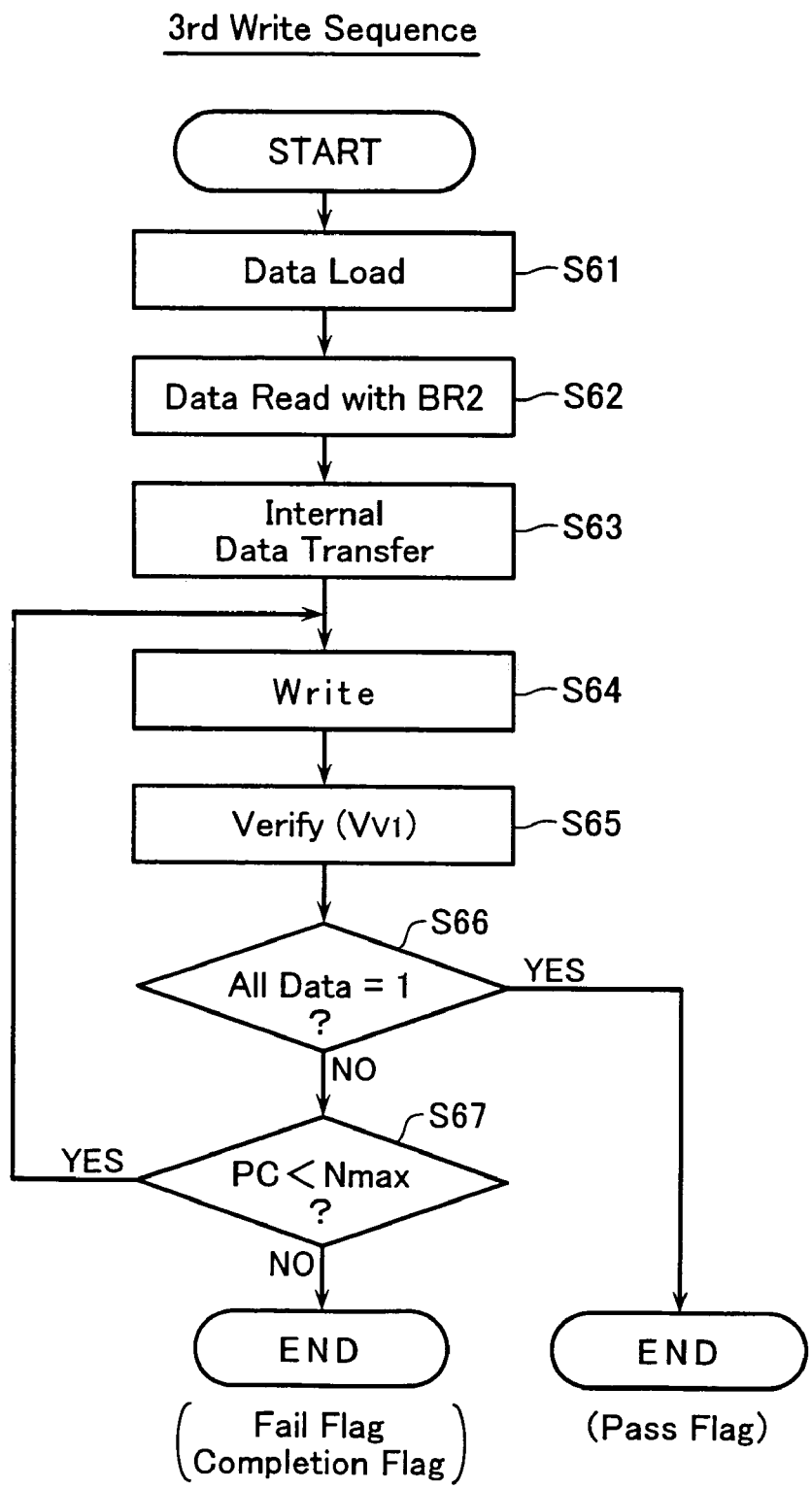
FIG. 16 shows an operation flow of the third write sequence.

FIG. 16 shows the third write sequence, in which command and address input steps are omitted. As shown in FIG. 16, write data are loaded (step S61), following it cell array data is read out (step S62). Since this sequence also is the upper page write one, as shown in FIG. 18, the loaded data become "1", "0", "1" and "0" corresponding to data "A", "B", "C" and "D", respectively. The internal data read at step S62 is performed with read voltage BR2 set between data "B" and "C" as shown in FIG. 14.

Since data "C" and "D" have already been written, in this write sequence, "0" write is selectively performed for cells of data "A" so as to obtain data "B". For this purpose, cells with data "C" and "D" written therein are to be set at a "1" write state (i.e., write-inhibiting state). Therefore, as shown in FIG. 18, internal data transferring operations are performed among the data storage circuits PDC, SDC and DDC so that the write data initially stored in the data storage circuits PDC are set as "1", "0", "1" and "1" corresponding to data "A", "B", "C" and "D", respectively (step S63).

Data write will be performed based on the above-described write data (step S64). The write-verify is performed with verify voltage Vv1 set at the lowest threshold value of data "B" (step S65).

Since data "C" and "D" have already been written. As shown in FIG. 18, read data become "1", "0", "0", and "0" corresponding to data "A", "B", "C" and "D", respectively in the verify-read step. This is the condition of "Pass" of the write-verify.

The verify-read data are controlled in such a way that when the above-described condition of "Pass" is satisfied, the data storage circuits PDC become an all "1" state, and it is detected whether data write has been completed or not (step S66). In case data write is incomplete, it is detected whether the write count value PC has reached the maximum value Nmax or not (step S67). If NO, write operation will be repeated (step S64). In case data write is not completed in spite of that the count value PC has reached the maximum value Nmax, a "Fail" flag is output and the sequence ends in failure.

According to the upper page write order described above, the lower page data is not lost due to power supply shut-off. For example, suppose that the power supply is shut off in the course of the second write sequence as explained with reference to FIGS. 13 and 15. If the power supply is restored in this case, it is able to read out the lower page data "A" and "BC" with read voltage AR because data "B", the threshold voltage distribution of which is superimposed on that of data "BC", has not yet been written.

Further, in case the power supply is shut off in the course of the third write sequence as explained with reference to FIGS. 14 and 16 after having ended the second write sequence, the lower page data may be read out with read voltage BR2 set between the threshold voltage distributions of data "B" and "C".

In case the upper page write sequence ends in failure, the lower page data in the cell array will not be lost. When the write sequence shown in FIGS. 15 and 16 ends in failure, it is preferable that a sequence ending flag is output together with the "Fail" flag. In response to the sequence ending flag, the external memory controller is able to perform defect management after write-error. For example, a block BLKa, in which the write sequence has ended in failure, can be dealt as a defective block like the above-described embodiment 1. In this case, the internal controller 5 is able to execute a copy-write operation for copying data written in the defective block BLKa to a spare block BLKb in response to instructions from the external controller 11.

Figure 19:
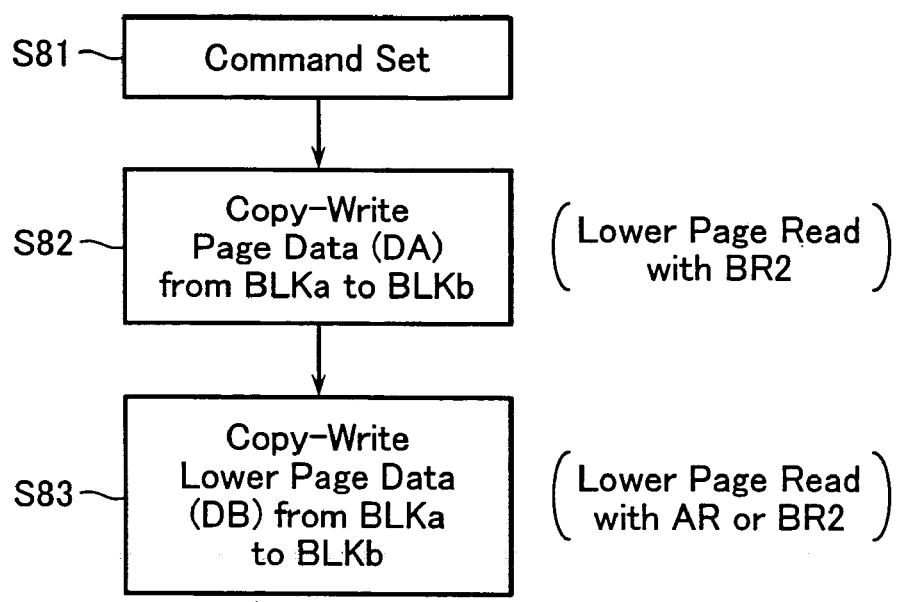
FIG. 19 shows a flow of a copy-write operation when the write sequence ends in failure.

FIG. 19 shows a flow of the copy-write operation. The internal controller 5 receives command supplied from the external controller 11 (step S81), thereby copy-writing data in the defective block BLKa to a spare block BLKb (steps S82 and S83).

At the copy-write time of step S82, page data (DA), the upper page data of which have been normally written, are sequentially read out and copy-written into the spare block BLKb. At this step, the read voltage BR2 will be used for reading the lower page data.

At the step S83, the lower page data (DB) of a page, in which write-error has been generated in the block BLKa, is read out and copy-written into the spare block BLKb. In case the write-error has been generated in the second write sequence, the read voltage AR is used for reading the lower page data. By contrast, in case the write-error has been generated in the third write sequence, the read voltage BR2 is used for reading the lower page data.

In case the power supply is shut off in the course of the upper page write sequence, it should be treated as described later. Note here that it should be treated in the similar way in case the upper page write sequence is suspended in response to a forcible reset command.

Figure 20:
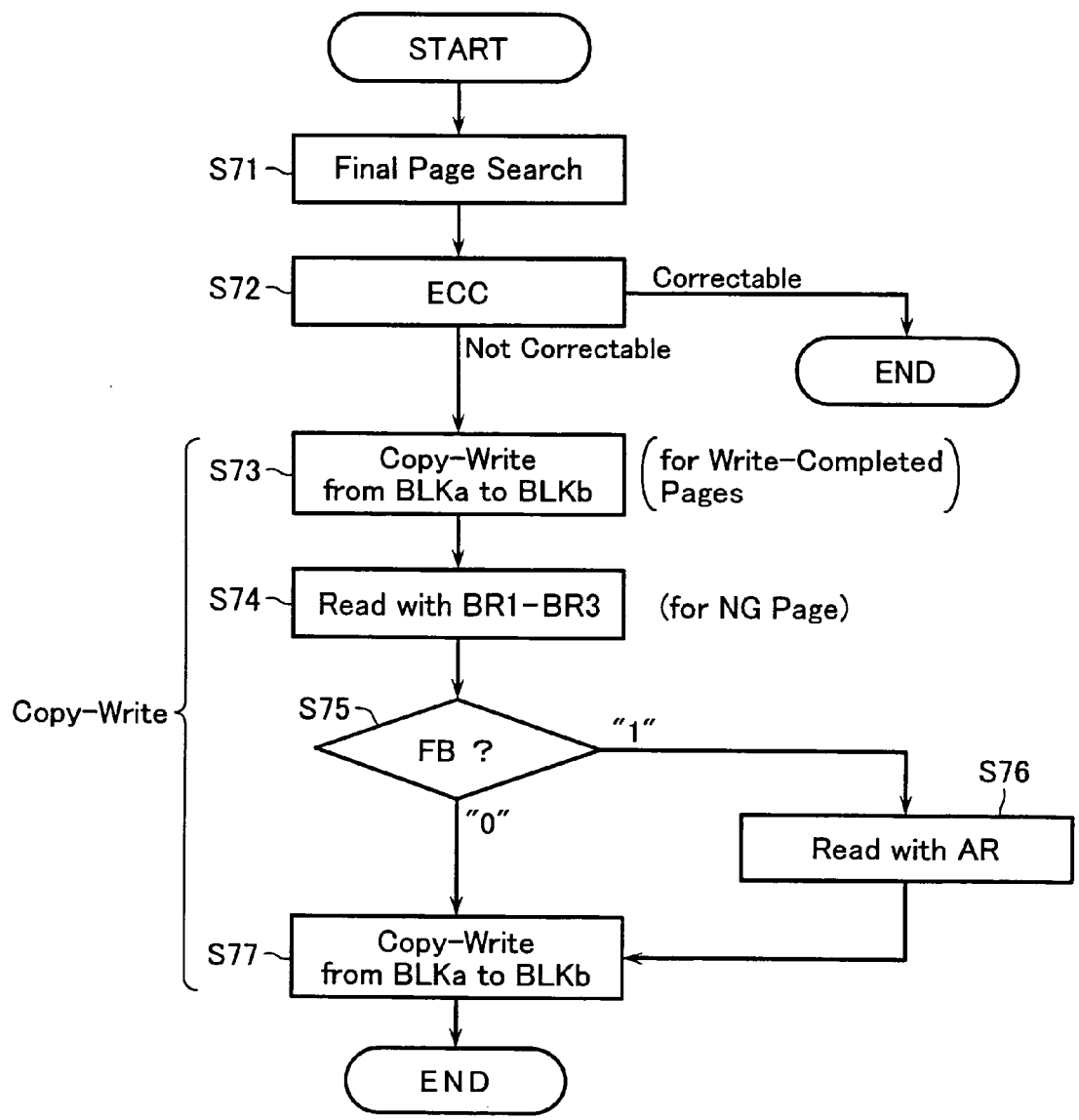
FIG. 20 is a diagram for explaining data correcting operation in a case that a write sequence is suspended due to power supply shut-off.

The treatment will be explained with reference to FIG. 20 below. After power ON, search the finally written page in the area, where data have been written in a selected block (step S71). The finally written page of the lower pages may be searched with the read voltage AR while the finally written page of the upper pages may be searched with reading out the first or second flag data "FA" or "FB".

Next, the finally written page data, which is searched as described above, is read out and subjected to error-checking and correcting with an ECC circuit (step S72). The ECC circuit is usually installed in the external controller 11, but it should be appreciated that the ECC circuit can be integrally formed on the memory chip. If correctable, deal the finally written page at the power shut-off as effective data, and then end the process. If it is not correctable, copy-write data written in the selected block BLKa to a spare block BLKb as well as the above-described embodiment.

In detail, page data written into the block BLKa are sequentially read out, and transferred to the spare block BLKb (step S73). With respect to the finally written page data, which is judged as it is not correctable, the upper page read is performed with read voltages BR1–BR3 (step S74).

Next, it is detected whether the flag data "FB" is "1" (i.e., the upper page has not been written) or "0" (i.e., the upper page has been written) (step S76). If FB=0, the read out upper page data is dealt as effective data and copied as it is to the spare block BLKb (step S77). In case of FB=1, the lower page data is read out with the read voltage AR (step S76), and it is copied to the spare block BKKb step S77).

As described above, even if the power supply is shut off halfway in the upper page write sequence, it is possible to correct data. Note here that the copy-write operation performed in the steps of S73–S77 shown in FIG. 20 may be made an independent sequence, which is executed in response to another command input. Further, this copy-write operation may be made an internal function in the flash memory chip.

EMBODIMENT 3

As an embodiment, an electric card using the non-volatile semiconductor memory devices according to the above-described embodiments 1–2 of the present invention and an electric device using the card will be described bellow.

Figure 21:
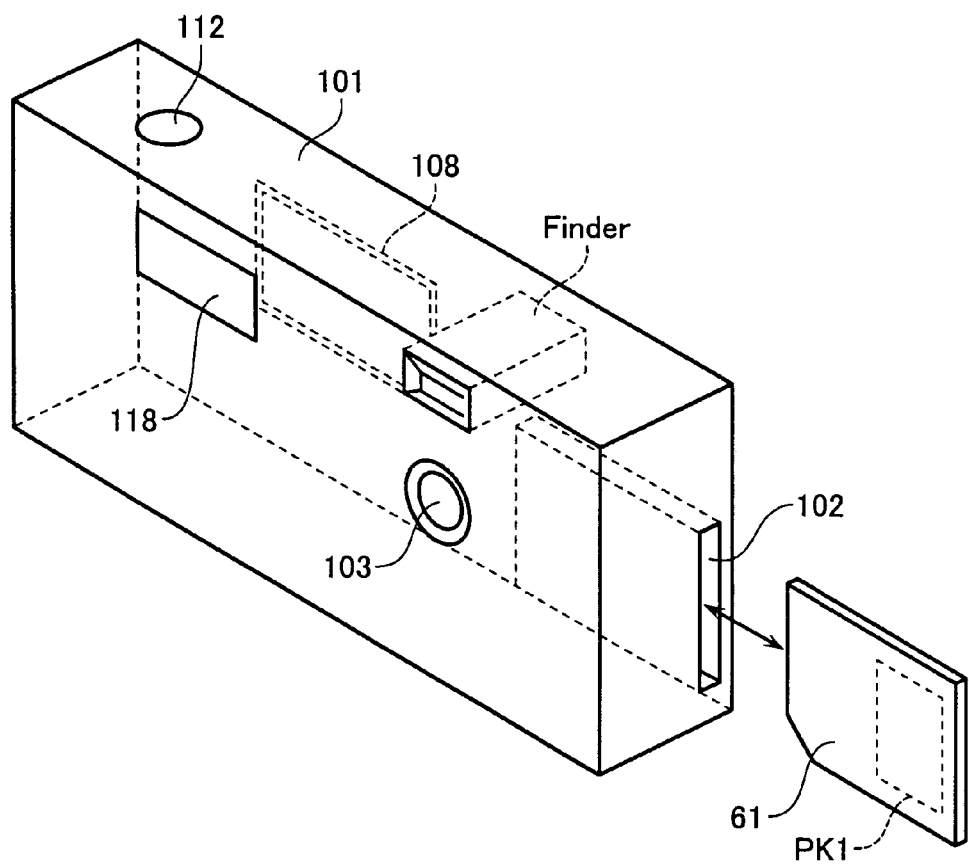
FIG. 21 shows another embodiment applied to a digital still camera.

FIG. 21 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 22:
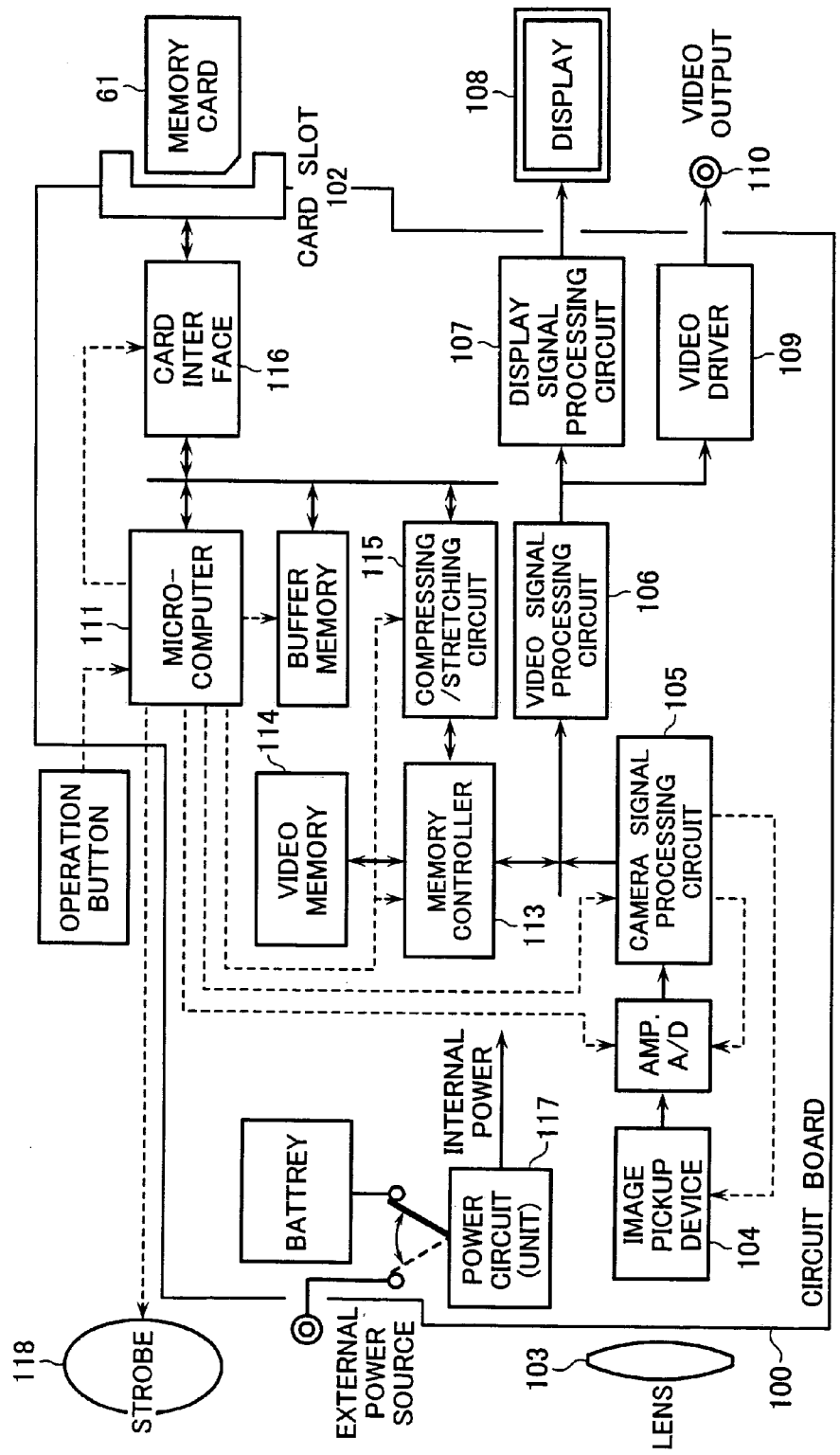
FIG. 22 shows the internal configuration of the digital still camera.
Figure 23A:
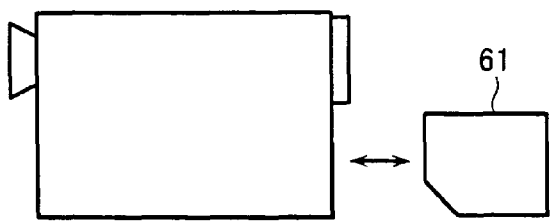
FIGS. 23A to 23J show other electric devices to which the embodiment is applied.
Figure 23F:
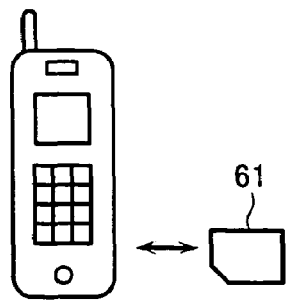
Figure 23B:
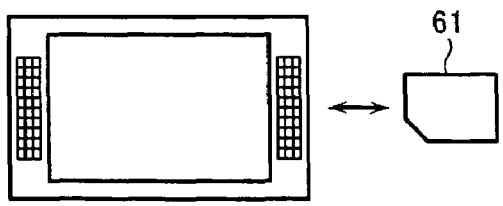
Figure 23G:
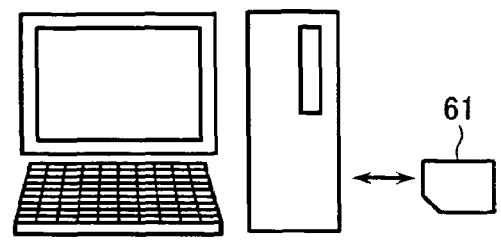
Figure 23C:
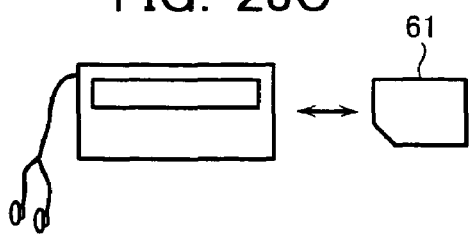
Figure 23H:
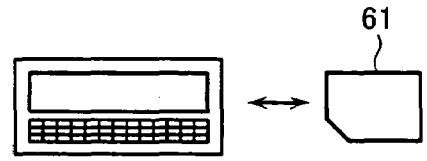
Figure 23D:
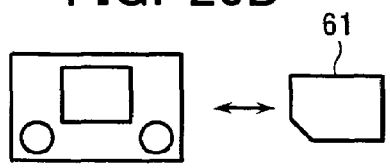
Figure 23I:
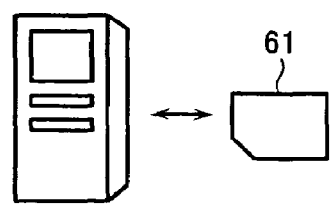
Figure 23E:
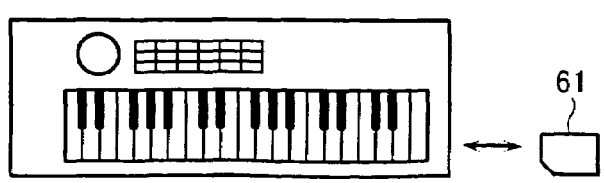
Figure 23J:
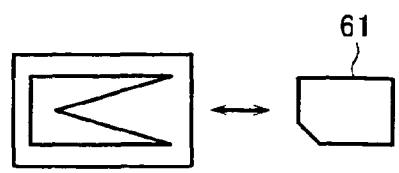

FIG. 22 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 23A to 23J, as well as in portable electric devices. That is, the electric card can also be used in a video camera shown in FIG. 23A, a television set shown in FIG. 23B, an audio apparatus shown in FIG. 23C, a game apparatus shown in FIG. 23D, an electric musical instrument shown in FIG. 23E, a cell phone shown in FIG. 23F, a personal computer shown in FIG. 23G, a personal digital assistant (PDA) shown in FIG. 23H, a voice recorder shown in FIG. 23I, and a PC card shown in FIG. 23J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
a memory cell array, in which electrically rewritable and non-volatile memory cells are arranged to store multi-value data;
a sense amplifier circuit configured to read data of and write data in said memory cell array; and
a controller configured to control data read and write of the memory cell array, wherein
said controller has such a function as, when an upper page data write sequence ends in failure, the upper page data being one to be written into an area of said memory cell array where lower page data has already been written, to cache the lower page data read out of said memory cell array and held in said sense amplifier circuit.

2. The semiconductor memory device according to claim 1, wherein
the lower page data held in said sense amplifier circuit is cached in said controller when the upper page data write sequence ends in failure.

3. The semiconductor memory device according to claim 1, wherein
the lower page data held in said sense amplifier circuit is output outside of the memory device and cached in an external memory controller when the upper page data write sequence ends in failure.

4. The semiconductor memory device according to claim 1, wherein
the multi-value data is four-value data "xy" (where "x" and "y" are upper page and lower page data, respectively, and "11", "10", "00" and "01" are assigned in order of cell's threshold voltage).

5. The semiconductor memory device according to claim 4, wherein
a four-value data write mode controlled by said controller includes: a lower page data write operation for selectively writing data "10" in a sector of said memory cell array, the entire memory cells of which have been erased in a data "11" state; and an upper page data write operation for selectively writing data "00" and "01" into memory cells with data "10" and "11" stored in the sector, respectively.

6. The semiconductor memory device according to claim 1, wherein
in case an upper page write sequence for a block in said memory cell array ends in failure, said controller controls in response to a command input for reading out data written in the block and writing it into a spare block; and writing the cached lower page data into the spare block.

7. The semiconductor memory device according to claim 1, wherein
said memory cell array has a plurality of NAND cell units arranged therein, each NAND cell unit having: a memory cell string with a plurality of memory cells connected in series; and first and second select gate transistors, which couple the both ends of memory cell string to a bit line and a common source line, respectively.

8. An electric device equipped with a semiconductor memory device, the semiconductor memory device comprising:
a memory cell array, in which electrically rewritable and non-volatile memory cells are arranged to store multi-value data;
a sense amplifier circuit configured to read data of and write data in said memory cell array; and
a controller configured to control data read and write of the memory cell array, wherein
said controller has such a function as, when an upper page data write sequence ends in failure, the upper page data being one to be written into an area of said memory cell array where lower page data has already been written, to cache the lower page data read out of said memory cell array and held in said sense amplifier circuit.

9. A semiconductor memory device comprising:
a memory cell array with electrically rewritable and non-volatile memory cells arranged therein; and
a controller configured to control data write of said memory cell array, wherein
each memory cell in said memory cell array is to store one of four-value data "xy" (where "x" and "y" are upper and lower page data, respectively, and "11", "01", "10" and "00" are assigned in order of cell's threshold voltage), and wherein
said controller executes:
a first write sequence for writing intermediate data into memory cells to be written into data "10" in a sector of said memory cell array, the entire memory cells of which have been erased in a data "11" state, the intermediate data being defined by a threshold voltage lower than a desired threshold voltage of data "10";
a second write sequence for writing data "10" and "00" into the memory cells with the intermediate data written in the sector; and
a third write sequence for writing data "01" into the memory cells with data "11" in the sector after the second write sequence.

10. The semiconductor memory device according to claim 9, wherein
a first flag data is written simultaneously with data "10" and "00" in the second write sequence, the first flag data having a first threshold voltage distribution, the lowest value of which is the same as that of data "00", and wherein
a second flag data is written simultaneously with data "01" in the third write sequence, the second flag data having a second threshold voltage distribution, the lowest value of which is the same as that of data "01".

11. The semiconductor memory device according to claim 9, wherein
in case the second or third write sequence for a block in said memory cell array ends in failure, said controller controls in response to a command input for reading data written into the block and writing it into a spare block; and for reading lower page data in an area where upper page data write has failed and writing it into the spare block.

12. The semiconductor memory device according to claim 9, wherein
in case the second or third write sequence for a block in said memory cell array is forcedly suspended due to power supply shut-off or command input, final page data of an area in the block, where data have already been written, is read out to be subjected to error-checking and correcting, and wherein
if error-correcting is possible, the sequence ends, while if not so, all data of the area in the block is read out and written into a spare block.

13. The semiconductor memory device according to claim 9, wherein
said memory cell array has a plurality of NAND cell units arranged therein, each NAND cell unit having: a memory cell string with a plurality of memory cells connected in series; and first and second select gate transistors, which couple both ends of the memory cell string to a bit line and a common source line, respectively.

14. An electric device equipped with a semiconductor memory device, said semiconductor memory device comprising:
a memory cell array with electrically rewritable and non-volatile memory cells arranged therein; and
a controller configured to control data write of said memory cell array, wherein each memory cell in said memory cell array is to store one of four-value data "xy" (where "x" and "y" are upper and lower page data, respectively, and "11", "01", "10" and "00" are assigned in order of cell's threshold voltage), and wherein
said controller executes:
a first write sequence for writing intermediate data into memory cells to be written into data "10" in a sector of said memory cell array, the entire memory cells of which have been erased in a data "11" state, the intermediate data being defined by a threshold voltage lower than a desired threshold voltage of data "10";

a second write sequence for writing data "10" and "00" into the memory cells with the intermediate data written in the sector; and a third write sequence for writing data "01" into the memory cells with data "11" in the sector after the second write sequence.

15. A method of writing data to a semiconductor memory device having a memory cell array, in which electrically rewritable and non-volatile memory cells are arranged, each memory cell being to store one of four-value data "xy" (where "x" and "y" are upper and lower page data, respectively, and "11", "10", "00" and "01" are assigned in order of cell's threshold voltage), comprising:

executing a lower page write sequence for selectively writing data "10" into memory cells in a sector of said memory cell array, which are erased in a data "11" state; and executing an upper page write sequence for selectively writing data "01" and "00" into memory cells with data "11" and "10" written, respectively, in the sector, wherein when the upper page write sequence ends in failure, lower page data read out of said memory cell array and held in a sense amplifier circuit is cached.

16. The method according to claim 15, wherein in case an upper page write sequence for a block in said memory cell array ends in failure, reading out data written in the block and writing it into a spare block; and writing the cached lower page data into the spare block.

17. A method of writing data to a semiconductor memory device having a memory cell array, in which electrically rewritable and non-volatile memory cells are arranged, each memory cell being to store one of four-value data "xy" (where "x" and "y" are upper and lower page data, respectively, and "11", "01", "10" and "00" are assigned in order of cell's threshold voltage), comprising:

executing a first write sequence for writing intermediate data into memory cells to be written into a data "10" state in a sector of said memory cell array, the entire memory cells of which have been erased in a data "11" state, the intermediate data being defined by a threshold voltage lower than a desired threshold voltage of data "10";

executing a second write sequence for writing data "10" and "00" into the memory cells with the intermediate data written in the sector; and executing a third write sequence for writing data "01" into the memory cells with data "11" in the sector after the second write sequence.

18. The method according to claim 17, wherein a first flag data is written simultaneously with data "10" and "00" in the second write sequence, the first flag data having a first threshold voltage distribution, the lowest value of which is the same as that of data "00", and wherein a second flag data is written simultaneously with data "01" in the third write sequence, the second flag data having a second threshold voltage distribution, the lowest value of which is the same as that of data "01".

19. The method according to claim 17, wherein in case the second or third write sequence for a block in said memory cell array ends in failure, reading out data written into the block and writing it into a spare block; and reading lower page data in an area where upper page data write has been failed and writing it into the spare block.

20. The method according to claim 17, wherein in case the second or third write sequence for a block in said memory cell array is forcedly suspended due to power supply shut-off or command input, final page data of the area where data have been written in the block is read out to be subjected to error-checking and correcting, and wherein if error-correcting is possible, the sequence ends, while if not so, all data of the area in the block is read out and written into a spare block.

* * * * *